(12) United States Patent
Yun et al.

(10) Patent No.: US 12,211,891 B2
(45) Date of Patent: Jan. 28, 2025

(54) SEMICONDUCTOR DEVICES

(71) Applicant: Samsung Electronics Co., Ltd., Suwon-si (KR)

(72) Inventors: Cheol Ju Yun, Suwon-si (KR); Youn Seon Kang, Yongin-si (KR); Eun Shoo Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 379 days.

(21) Appl. No.: 17/867,011

(22) Filed: Jul. 18, 2022

(65) Prior Publication Data
US 2023/0112600 A1 Apr. 13, 2023

(30) Foreign Application Priority Data

Oct. 7, 2021 (KR) .......................... 10-2021-0133510

(51) Int. Cl.
*H10B 12/00* (2023.01)
*H01L 49/02* (2006.01)

(52) U.S. Cl.
CPC .............. *H01L 28/86* (2013.01); *H01L 28/90* (2013.01); *H10B 12/315* (2023.02)

(58) Field of Classification Search
CPC ......... H01L 28/86; H01L 28/90; H01L 28/82; H01L 28/60; H01L 28/92; H10B 12/315; H10B 12/30; H10B 12/31; H10B 12/03; H10B 12/05; H10B 12/033
See application file for complete search history.

(56) References Cited

U.S. PATENT DOCUMENTS

| | | | |
|---|---|---|---|
| 6,407,814 B1 | 6/2002 | Yasuda | |
| 6,721,938 B2 | 4/2004 | Pierrat et al. | |
| 6,818,389 B2 | 11/2004 | Fritze et al. | |
| 7,673,258 B2 | 3/2010 | Kyoh | |
| 9,230,866 B2 | 1/2016 | Lee et al. | |
| 2008/0042182 A1* | 2/2008 | Park | H01L 28/91 257/E29.345 |
| 2018/0158827 A1 | 6/2018 | You et al. | |

FOREIGN PATENT DOCUMENTS

| | | |
|---|---|---|
| JP | 2001092107 A | 4/2001 |
| KR | 100752193 B1 | 8/2007 |
| KR | 20210010773 A | 1/2021 |

* cited by examiner

*Primary Examiner* — Thanhha S Pham
(74) *Attorney, Agent, or Firm* — Myers Bigel, P.A.

(57) ABSTRACT

There is provided a semiconductor device capable of improving performance and reliability of a device, by adjusting the arrangement of penetration patterns included in an electrode support for supporting the lower electrode. The semiconductor device includes a plurality of lower electrodes that are aligned with each other on a substrate along a first direction and a second direction different from the first direction, and a first electrode support that supports the lower electrodes, and includes a plurality of first penetration patterns, wherein the first electrode support includes a center region, and an edge region defined along a periphery of the center region, wherein the first penetration patterns include center penetration patterns that are spaced apart by a first interval in the center region, and wherein the first penetration patterns include edge penetration patterns that are spaced apart by a second interval different from the first interval in the edge region.

20 Claims, 25 Drawing Sheets

FIG. 2
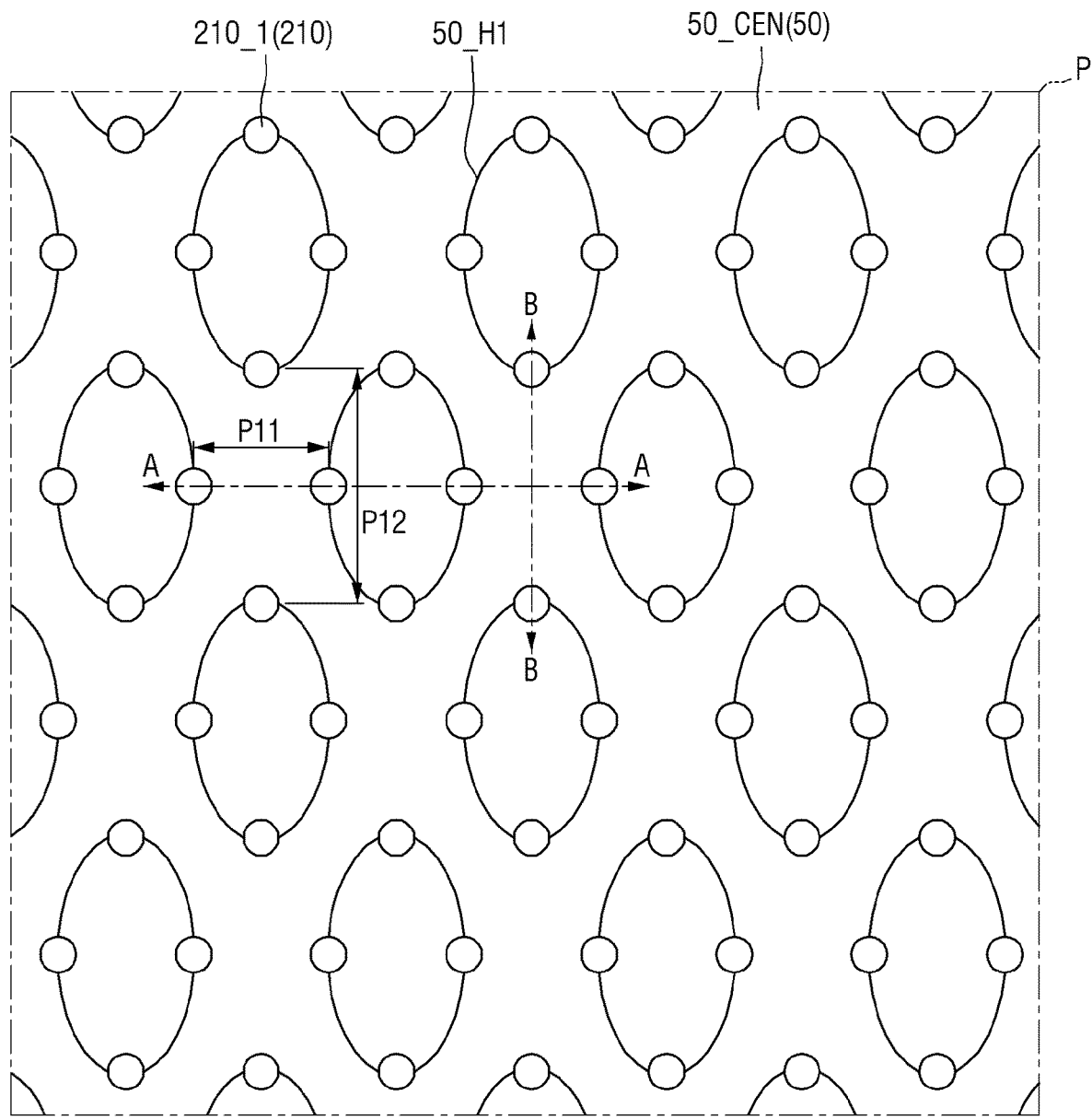
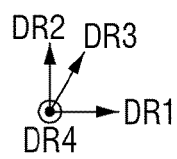

SEMICONDUCTOR DEVICES

CROSS-REFERENCE TO RELATED APPLICATION

This application claims priority from Korean Patent Application No. 10-2021-0133510 filed on Oct. 7, 2021 in the Korean Intellectual Property Office, the disclosure of which is incorporated herein by reference in its entirety.

BACKGROUND

1. Field of the Invention

The present disclosure relates to semiconductor devices.

2. Description of the Related Art

In recent years, with a large capacity and a high integration of semiconductor elements, design rules have also continuously decreased. For example, such a tendency appears in a DRAM, which is one type of semiconductor memory element. In order for the DRAM device to operate, a capacitance of a certain level or higher may be required for each cell.

To this end, a method of utilizing a dielectric film having a high dielectric constant for a capacitor or increasing a contact area between a lower electrode of a capacitor and a dielectric film is being studied. For example, when increasing the height of the lower electrode, since the contact area between the lower electrode and the dielectric film increases, the capacitance of the capacitor increases.

Usage of a support structure capable of supporting the lower electrode has been proposed to inhibit/prevent the lower electrode from tilting or collapsing as the height of the lower electrode increases.

SUMMARY

Aspects of the present disclosure provide a semiconductor device capable of improving performance and reliability of a device, by adjusting the arrangement of penetration patterns included in an electrode support for supporting the lower electrode.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a plurality of lower electrodes that are aligned with each other on a substrate along a first direction and a second direction different from the first direction, and a first electrode support that supports the lower electrodes, and includes a plurality of first penetration patterns, wherein the first electrode support includes a center region, and an edge region defined along a periphery of the center region, wherein the first penetration patterns include center penetration patterns adjacent to each other that are spaced apart by a first interval in the center region, and wherein the first penetration patterns include edge penetration patterns adjacent to each other that are spaced apart by a second interval different from the first interval in the edge region.

According to another aspect of the present disclosure, there is provided a semiconductor device comprising a first capacitor block, a second capacitor block that is spaced apart from the first capacitor block by a first distance in a first direction, and a third capacitor block that is spaced apart from the first capacitor block by a second distance in the first direction, wherein the second distance is greater than the first distance, wherein the first capacitor block includes a plurality of lower electrodes that are aligned with each other on a substrate along a first direction and a second direction different from the first direction, and an electrode support that supports the lower electrode and includes a plurality of penetration patterns, wherein the electrode support includes a center region, and an edge region defined along a periphery of the center region, wherein the edge region includes a first sub-edge region that overlaps the second capacitor block in the first direction, and a second sub-edge region that overlaps the third capacitor block in the first direction, wherein the penetration patterns include center penetration patterns adjacent to each other that are spaced apart by a first interval in the center region, wherein the penetration patterns include first sub-edge penetration patterns adjacent to each other that are spaced apart by a second interval in the first sub-edge region, wherein the penetration patterns include second sub-edge penetration patterns adjacent to each other that are spaced apart by a third interval different from the second interval in the second sub-edge region, and wherein the first interval is different from the second interval and the third interval.

According to still another aspect of the present disclosure, there is provided a semiconductor device comprising a plurality of lower electrodes that are aligned with each other on a substrate along a first direction and a second direction different from the first direction, each of the lower electrodes extending longitudinally in a third direction that is perpendicular to the first and second directions, and a first electrode support that supports the lower electrodes, and includes a plurality of first penetration patterns, wherein upper surfaces of the lower electrodes are coplanar with an upper surface of the first electrode support, wherein the first electrode support includes a center region, and an edge region defined along a periphery of the center region, wherein portions of the lower electrodes that are in contact with the edge region bend toward a center of the first electrode support, wherein the first penetration patterns include center penetration patterns adjacent to each other that are spaced apart by a first interval, in the center region, and wherein the first penetration patterns include edge penetration patterns adjacent to each other that are spaced apart by a second interval smaller than the first interval, in the edge region.

BRIEF DESCRIPTION OF THE DRAWINGS

The above and other aspects and features of the present disclosure will become more apparent by describing example embodiments thereof in detail with reference to the attached drawings, in which:

FIG. 2 is an enlarged plan view of a portion P of FIG. 1;

DETAILED DESCRIPTION

Drawings of a semiconductor device according to some embodiments show capacitors and electrode supports included in a dynamic random access memory (DRAM).

Figure 1:
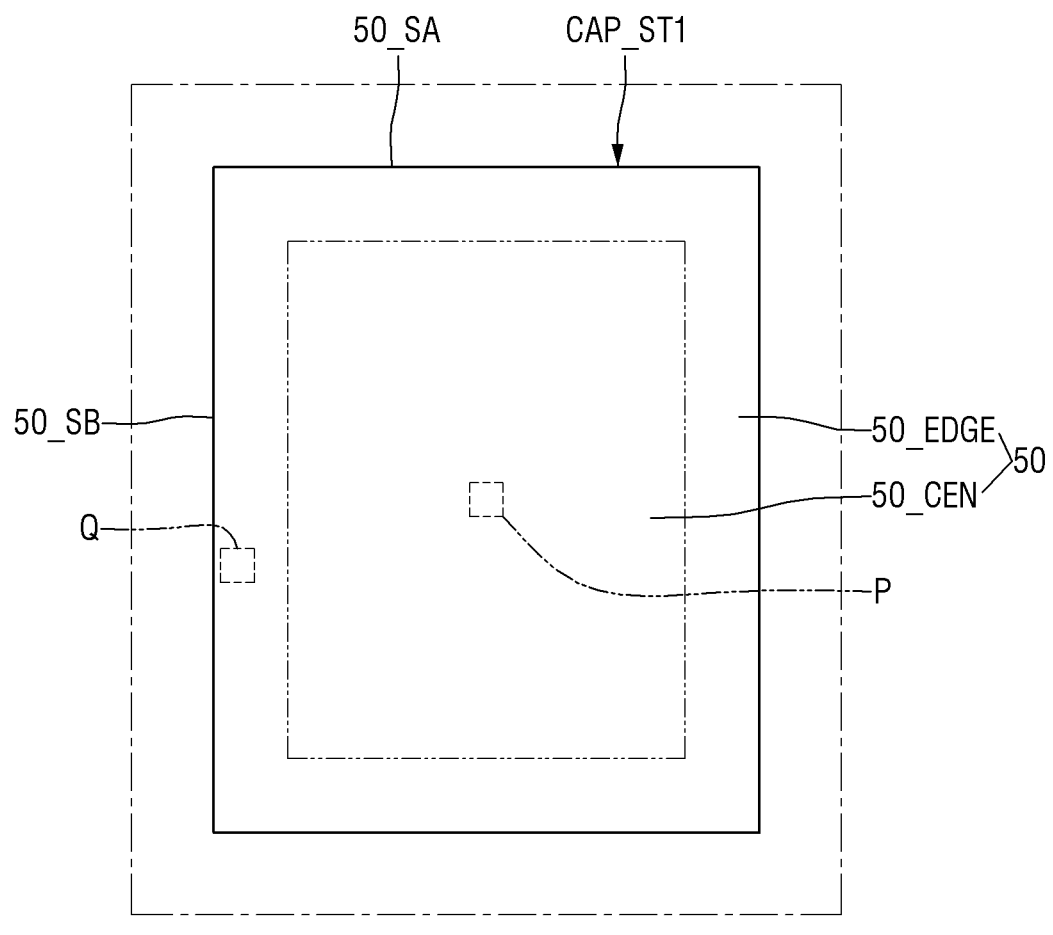
FIG. 1 is a schematic plan view for explaining the semiconductor device according to some embodiments.
Figure 3:
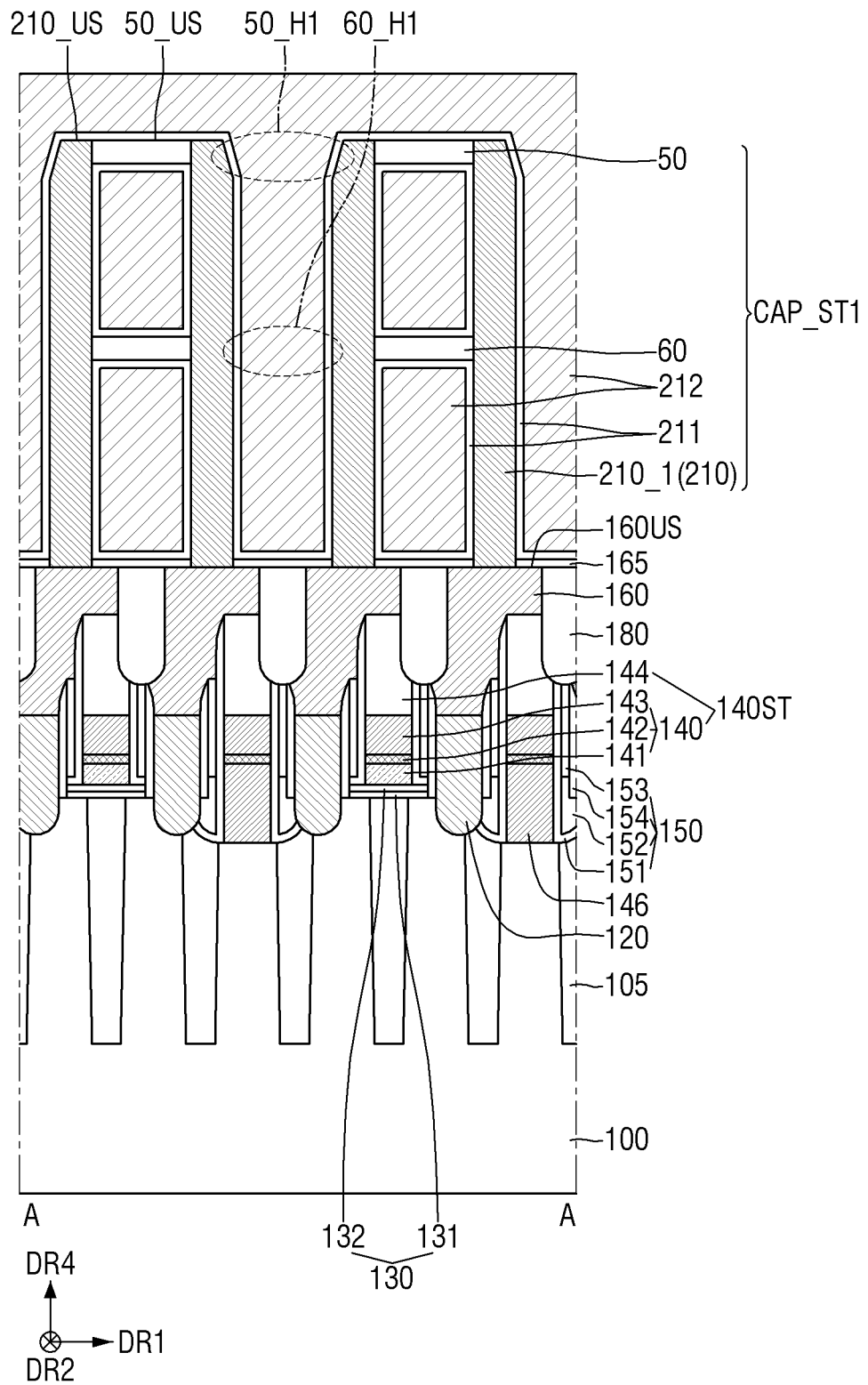
FIGS. 3 and 4 are example cross-sectional diagrams taken along lines A-A and B-B, respectively, of FIG. 2.
Figure 4:
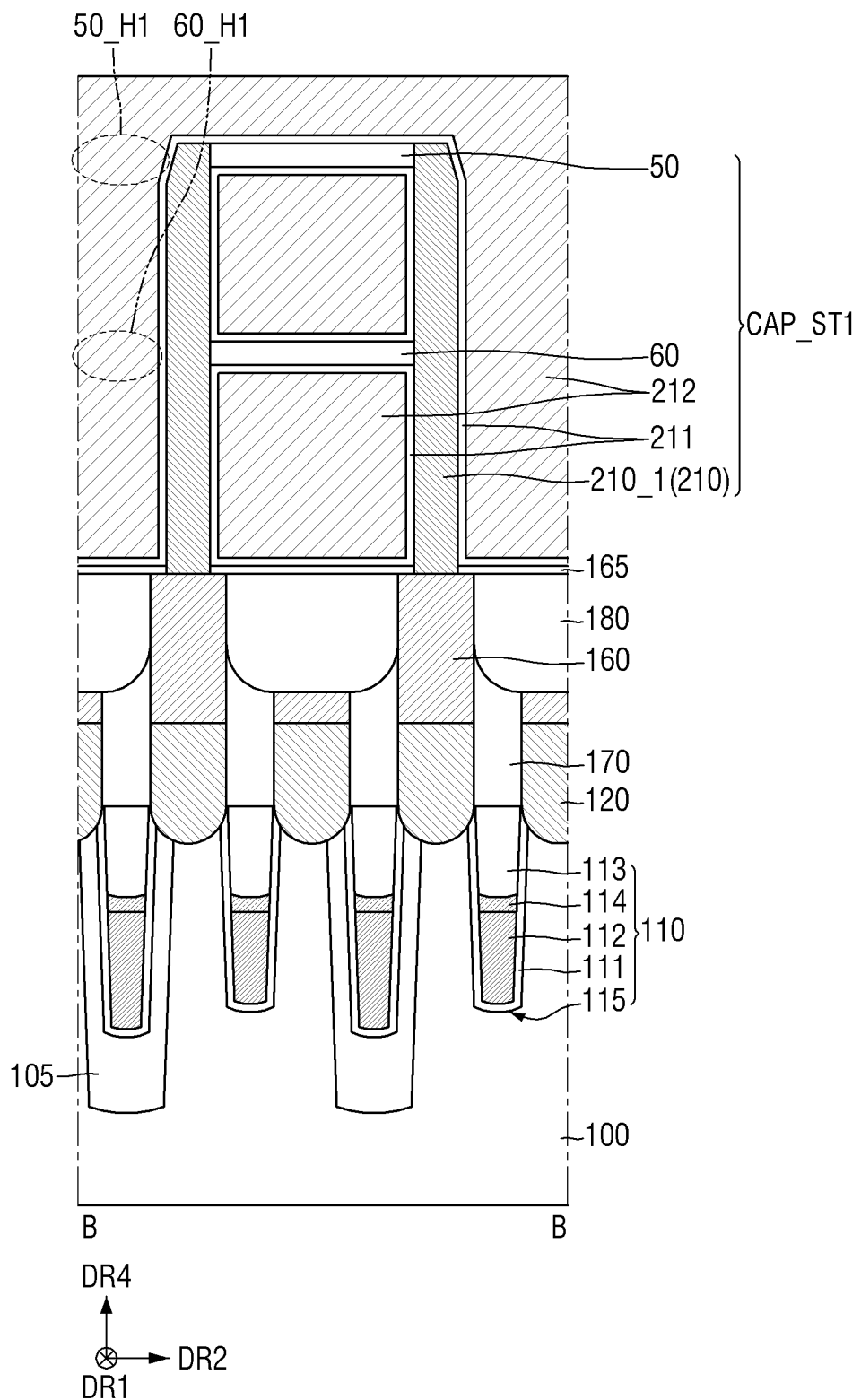
Figure 5:
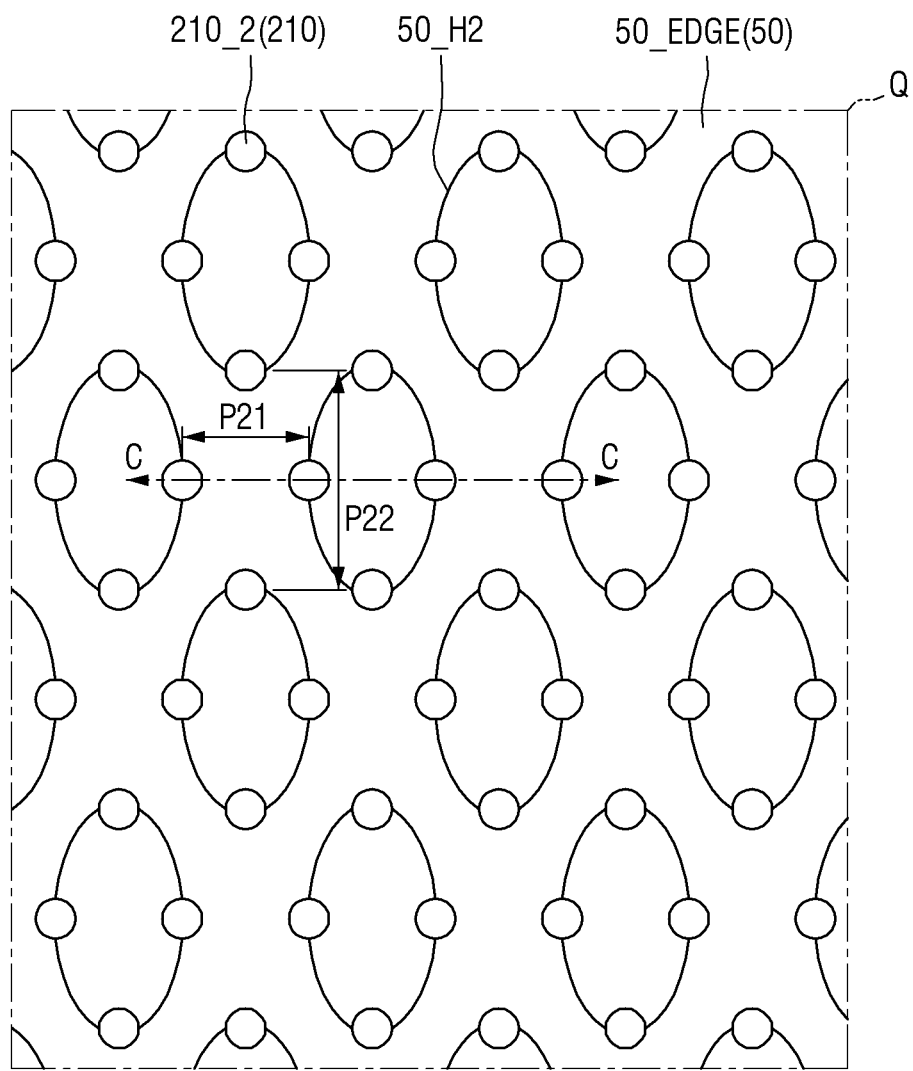
FIG. 5 is an enlarged plan view of a portion Q of FIG. 1.
Figure 6:
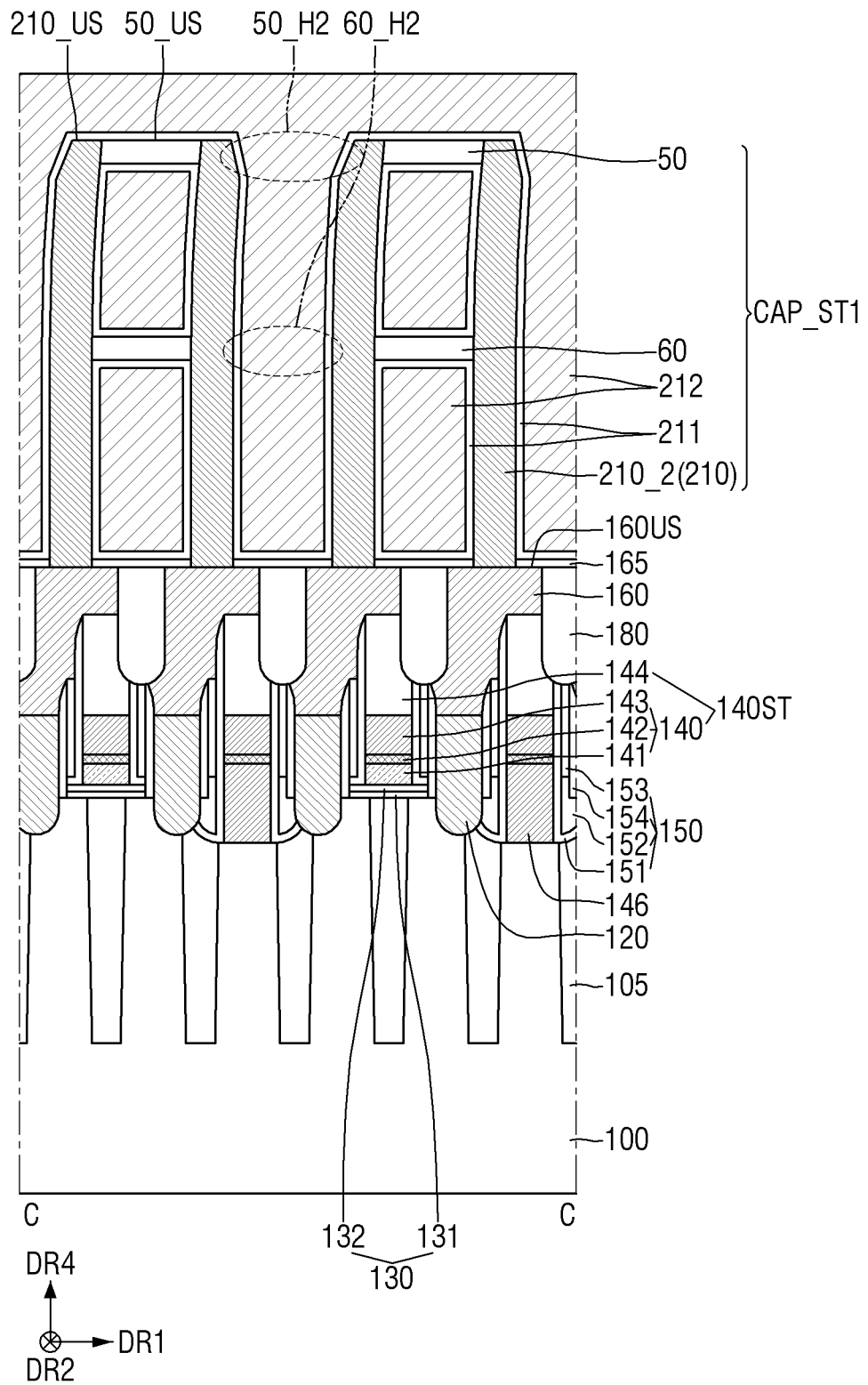
FIG. 6 is an example cross-sectional diagram taken along line C-C of FIG. 5.
Figure 7:
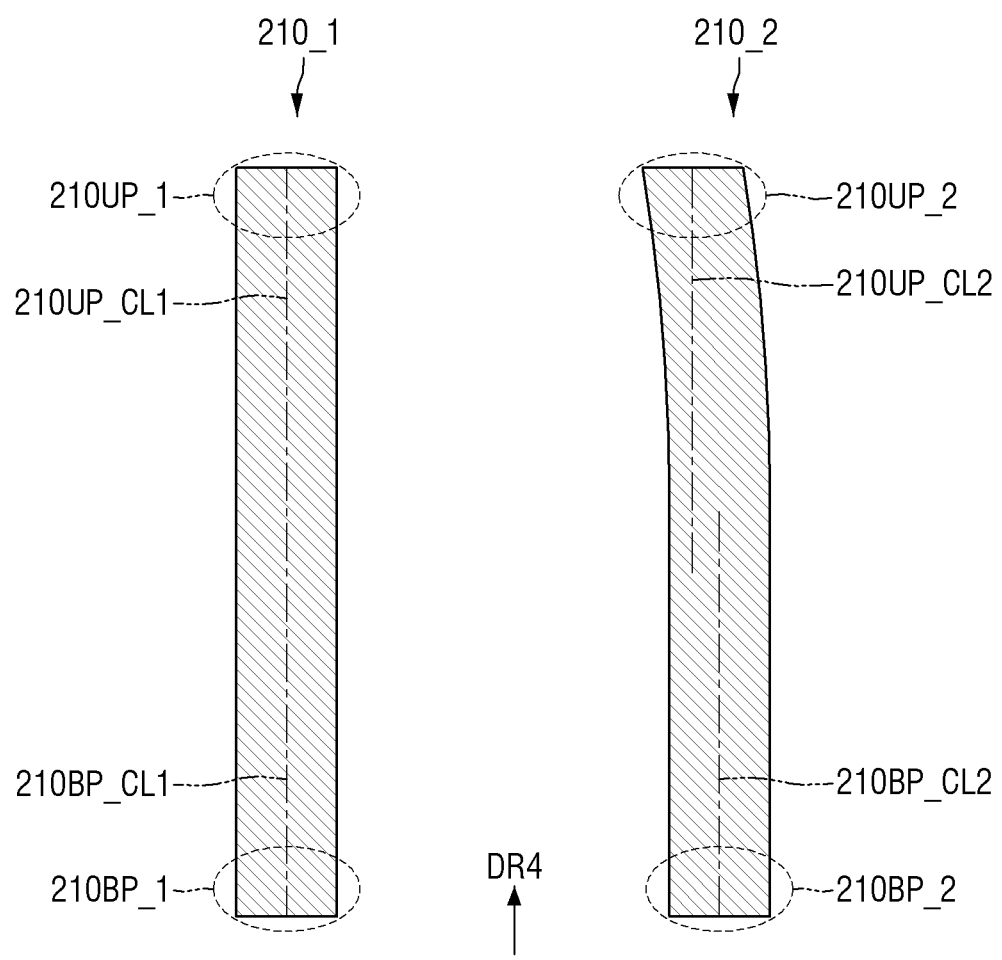
FIG. 7 is a diagram for explaining shapes of a first lower electrode of FIG. 2 and a second lower electrode of FIG. 5.

FIG. 1 is a schematic plan view for explaining the semiconductor device according to some embodiments. FIG. 2 is an enlarged plan view of a portion P of FIG. 1. FIGS. 3 and 4 are example diagrams taken along A-A and B-B of FIG. 2. FIG. 5 is an enlarged plan view of a portion Q of FIG. 1. FIG. 6 is an example diagram taken along C-C of FIG. 5. FIG. 7 is a diagram for explaining shapes of a first lower electrode of FIG. 2 and a second lower electrode of FIG. 5.

For simplicity of illustration, a lower electrode 210, a capacitor insulating (e.g., dielectric) film 211, and an upper electrode 212 are not shown in FIG. 1. In addition, the capacitor insulating film 211 and the upper electrode 212 are not shown in FIGS. 2 and 5. When cutting FIG. 5 in the same manner as in B-B of FIG. 2, it may be similar to FIG. 4 except that the lower electrode 210 bends.

Referring to FIGS. 1 to 7, the semiconductor device according to some embodiments may include a first capacitor block CAP_ST1.

The first capacitor block CAP_ST1 may be disposed on the substrate 100. The first capacitor block CAP_ST1 may include a plurality of lower electrodes 210, a capacitor dielectric film 211, an upper electrode 212, a first electrode support 50, and a second electrode support 60.

The substrate 100 may be bulk silicon or silicon on insulator (SOI). Moreover, the substrate 100 may be a silicon substrate or may include other materials, for example, but are not limited to, silicon germanium, silicon germanium on-insulator (SGOI), indium antimonide, lead tellurium compounds, indium arsenide, indium phosphate, gallium arsenide or gallium antimonide.

The substrate 100 may be formed with unit elements necessary for forming a semiconductor element such as various types of active elements or passive elements. The unit elements may be, for example, cell transistors such as a DRAM (Dynamic Random Access Memory) or a flash memory.

A plurality of lower electrodes 210 may be disposed on the substrate 100. Each lower electrode 210 may extend long (i.e., longitudinally) in a fourth direction DR4.

The lower electrode 210 may have, for example, a pillar shape. The lower electrode 210 may have a solid pillar shape.

The plurality of lower electrodes 210 may be repeatedly arranged/aligned with each other along a first direction DR1 and a second direction DR2. For example, each lower electrode 210 may be aligned with first ones of the lower electrodes 210 in the first direction DR1 and may be aligned with second ones of the lower electrodes 210 in the second direction DR2. The first direction DR1 and the second direction DR2 may be orthogonal to each other, but are not limited thereto. The first direction DR1 and the second direction DR2 may each be orthogonal (i.e., perpendicular) to a fourth direction DR4.

The plurality of lower electrodes 210 may be repeatedly arranged/aligned in the first direction DR1. The lower electrodes 210 arranged/aligned in the first direction DR1 may be disposed to be spaced apart by a first distance/pitch. The first distance/pitch may be a shortest distance between the side walls of ones of the lower electrodes 210 adjacent to each other in the first direction DR1.

In a center region of the first capacitor block CAP_ST1, the first distance/pitch between the lower electrodes 210 arranged/aligned in the first direction DR1 may different from the first distance/pitch between the lower electrodes 210 arranged/aligned in the first direction DR1 in an edge region of the first capacitor block CAP_ST1. A description thereof will be provided later.

The lower electrodes 210 repeatedly arranged/aligned in the first direction DR1 may also be repeatedly arranged/aligned in the second direction DR2. The lower electrodes 210 repeatedly arranged/aligned in the second direction DR2 may not all be linearly arranged along the second direction DR2.

The lower electrodes 210 arranged/aligned in the second direction DR2 may be arranged in a zigzag manner. More specifically, the plurality of lower electrodes 210 may include a first group of the lower electrodes 210 and a second group of the lower electrodes 210 that are repeatedly arranged/aligned in the first direction DR1. The first group of the lower electrodes 210 and the second group of the lower electrodes 210 may be adjacent to each other in the second direction DR2. No additional group of lower electrodes 210 repeatedly arranged/aligned in the first direction DR1 is disposed between the first group of the lower electrodes 210 and the second group of the lower electrodes 210.

As shown in FIG. 2, a first center of each lower electrode 210 included in the first group of the lower electrodes 210 and a second center of each lower electrode 210 included in the second group of the lower electrodes 210 are not aligned along the second direction DR2.

In other words, an extension line passing through the center of each lower electrode 210 included in the first group of the lower electrodes 210 and extending in the second direction DR2 does not pass through the center of each lower electrode 210 included in the second group of the lower electrodes 210.

The plurality of lower electrodes 210 may be repeatedly arranged/aligned to be closest to each other in the first direction DR1 and the third direction DR3. For example, the first distance/pitch between the lower electrodes 210 adjacent to each other in the first direction DR1 may be substantially the same as the second distance/pitch between the lower electrodes 210 adjacent to each other in the third direction DR3. The third direction DR3 may intersect the first direction DR1 and the second direction DR2. The third direction DR3 may be orthogonal to the fourth direction DR4. The first to third directions DR1, DR2 and DR3 may be different directions disposed on a single plane.

In other words, the plurality of lower electrodes 210 may be repeatedly arranged/aligned so as to be closest to each other in the first direction DR1 and the third direction DR3.

Alternatively, the plurality of lower electrodes 210 may be repeatedly arranged/aligned so as to be located at a hexagonal structure and a center of the hexagonal structure.

The lower electrode 210 may include, for example, but not limited to, a doped semiconductor material, a conductive metal nitride (e.g., titanium nitride, tantalum nitride, niobium nitride or tungsten nitride, etc.), a metal (e.g., ruthenium, iridium, titanium or tantalum, etc.), and a conductive metal oxide (e.g., iridium oxide or niobium oxide, etc.).

The first electrode support 50 may be disposed on the substrate 100. The first electrode support 50 may have a plate-like shape extending in a direction aligned/parallel with an upper surface of the substrate 100. For example, the first electrode support 50 may be an electrode support disposed at the uppermost part in the electrode supports included in the first capacitor block CAP_ST1.

The first electrode support 50 may come into contact with the side walls of the lower electrode 210. The first electrode support 50 may support a plurality of lower electrodes 210.

The first electrode support 50 may inhibit/prevent the lower electrode 210 extending long in the fourth direction DR4 from tilting and falling. The lower electrode 210 extends in a thickness direction of the first electrode support 50.

For example, an upper surface 50_US of the first electrode support 50 may be coplanar with an upper surface 210_US of the lower electrode 210. That is, the lower electrode 210 may not protrude upward from/beyond the upper surface 50_US of the first electrode support 50.

The first electrode support 50 may include an insulating material. The first electrode support 50 may include, for example, at least one of silicon nitride (SiN), silicon carbonitride (SiCN), silicon boronitride (SiBN), silicon oxycarbide (SiOC), silicon oxynitride (SiON), silicon oxide (SiO), and silicon oxyarbonitride (SiOCN).

The first electrode support 50 may include outer walls that define a boundary of the first electrode support 50. The outer walls of the first electrode support 50 may define the boundary of the upper surface 50_US of the first electrode support 50.

The outer walls of the first electrode support 50 may include a first side wall 50_SA extending in the first direction DR1, and a second side wall 50_SB extending in the second direction DR2. The first side wall 50_SA of the first electrode support 50 may be connected to the second side wall 50_SB of the first electrode support 50.

Although the first side wall 50_SA of the first electrode support is shown to be directly connected to the second side wall 50_SB of the first electrode support, the present invention is not limited thereto. Unlike the shown example, the outer walls of the first electrode support 50 may further include connecting (i.e., intervening) side walls that connect the first side wall 50_SA of the first electrode support and the second side wall 50_SB of the first electrode support.

For example, in a plan view, the connecting side walls of the first electrode support 50 may include various shapes such as a straight line, a curved line, a stepped shape, and a wavy shape.

The first electrode support 50 may include a center region 50_CEN and an edge region 50_EDGE. The edge region 50_EDGE of the first electrode support 50 may be defined along the periphery of the center region 50_CEN of the first electrode support 50.

The center region 50_CEN of the first electrode support 50 is included in the center region of the first capacitor block CAP_ST1 described above. The edge region 50_EDGE of the first electrode support 50 is included in the edge region of the first capacitor block CAP_ST1.

The edge region 50_EDGE of the first electrode support 50 includes the first side wall 50_SA of the first electrode support 50 and the second side wall 50_SB of the first electrode support 50.

The first electrode support 50 may include a plurality of first penetration patterns 50_H1 and 50_H2 that penetrate the first electrode support 50. The plurality of first penetration patterns 50_H1 and 50_H2 may include a plurality of first center penetration patterns 50_H1 and a plurality of first edge penetration patterns 50_H2.

The center region 50_CEN of the first electrode support 50 includes a plurality of first center penetration patterns 50_H1. The edge region 50_EDGE of the first electrode support 50 includes a plurality of first edge penetration patterns 50_H2.

For example, the center region 50_CEN of the first electrode support 50 includes two or more first center penetration patterns 50_H1. The edge region 50_EDGE of the first electrode support 50 includes two or more first edge penetration patterns 50_H2. The first electrode support 50 may include four or more first penetration patterns 50_H1 and 50_H2.

For example, each of a first center penetration pattern 50_H1 and a first edge penetration pattern 50_H2 may be formed over four lower electrodes 210. Each of the first center penetration pattern 50_H1 and the first edge penetration pattern 50_H2 may intersect the four lower electrodes 210.

In the center region 50_CEN of the first electrode support 50, a plurality of first center penetration patterns 50_H1 may be repeatedly disposed along the first direction DR1 and the second direction DR2. The center region 50_CEN of the first electrode support 50 may include first center penetration patterns 50_H1 arranged/aligned in the first direction DR1. The center region 50_CEN of the first electrode support 50 may include first center penetration patterns 50_H1 arranged/aligned in the second direction DR2.

In the center region 50_CEN of the first electrode support, the first center penetration patterns 50_H1 adjacent to each other in the first direction DR1 may be spaced apart from each other by a first interval P11. The first center penetration patterns 50_H1 adjacent to each other in the second direction DR2 may be spaced apart from each other by a second interval P12. For example, the first interval P11 may be the shortest distance between the first center penetration patterns 50_H1 spaced apart from each other in the first direction DR1.

In the edge region 50_EDGE of the first electrode support 50, a plurality of first edge penetration patterns 50_H2 may be repeatedly disposed along the first direction DR1 and the second direction DR2. The edge region 50_EDGE of the first electrode support 50 may include first edge penetration patterns 50_H2 arranged/aligned in the first direction DR1.

The edge region 50_EDGE of the first electrode support 50 may include the first edge penetration patterns 50_H2 arranged/aligned in the second direction DR2.

In the edge region 50_EDGE of the first electrode support 50, the first edge penetration patterns 50_H2 adjacent to each other in the first direction DR1 may be spaced apart from each other by a third interval P21. The first edge penetration patterns 50_H2 adjacent to each other in the second direction DR2 may be spaced apart from each other by a fourth interval P22.

In the semiconductor device according to some embodiments, a spaced interval of the first center penetration patterns 50_H1 adjacent to each other in the center region 50_CEN of the first electrode support 50 differs from a spaced interval of the first edge penetration patterns 50_H2 adjacent to each other at the edge region 50_EDGE of the first electrode support 50. For example, the spaced interval of the first center penetration patterns 50_H1 adjacent to each other in the center region 50_CEN of the first electrode support 50 may be greater than the spaced interval of the first edge penetration patterns 50_H2 adjacent to each other at the edge region 50_EDGE of the first electrode support 50.

As an example, the first interval P11 by which the adjacent first center penetration patterns 50_H1 are spaced apart in the first direction DR1 may be greater than the third interval P21 by which the adjacent first edge penetration patterns 50_H2 are spaced apart in the first direction DR1. The second interval P12 by which the adjacent first center penetration patterns 50_H1 are spaced apart in the second direction DR2 may be greater than the fourth interval P22 by which the adjacent first edge penetration patterns 50_H2 are spaced apart in the second direction DR2.

As another example, the first interval P11 by which the adjacent first center penetration patterns 50_H1 are spaced apart in the first direction DR1 may be greater than the third interval P21 by which the adjacent first edge penetration patterns 50_H2 are spaced apart in the first direction DR1. The second interval P12 by which the adjacent first center penetration patterns 50_H1 are spaced apart in the second direction DR2 may be the same the fourth interval P22 by which the adjacent first edge penetration patterns 50_H2 are spaced apart in the second direction DR2.

As still another example, the first interval P11 by which the adjacent first center penetration patterns 50_H1 are spaced apart in the first direction DR1 may be the same as the third interval P21 by which the adjacent first edge penetration patterns 50_H2 are spaced apart in the first direction DR1. The second interval P12 by which the adjacent first center penetration pattern 50_H1 are spaced apart in the second direction DR2 may be greater than the fourth interval P22 by which the adjacent first edge penetration pattern 50_H2 are spaced apart in the second direction DR2.

Although not shown, moving toward the center of the first electrode support 50, the third interval P21 between the first edge penetration patterns 50_H2 adjacent to each other in the first direction DR1 may increase. Moving toward the center of the first electrode support 50, the third interval P21 between the first edge penetration patterns 50_H2 adjacent to each other in the first direction DR1 may converge with (e.g., increase to/be equal to) the first interval P11 between the first center penetration patterns 50_H1 adjacent to each other in the first direction DR1.

Also, moving toward the center of the first electrode support 50, the fourth interval P22 between the first edge penetration patterns 50_H2 adjacent to each other in the second direction DR2 may increase. Moving toward the center of the first electrode support 50, the fourth interval P22 between the first edge penetration patterns 50_H2 adjacent to each other in the second direction DR2 may converge with (e.g., increase to/be equal to) the second interval P12 between the first center penetration patterns 50_H1 adjacent to each other in the second direction DR2.

When the first interval P11 and the second interval P12 are measured in the vicinity of the center of the first electrode support 50, and the third interval P21 and the fourth interval P22 are measured in the vicinity adjacent to the first side wall 50_SA of the first electrode support and/or the second side wall 50_SB of the first electrode support, it is possible to clearly confirm that the spaced intervals P11 and P12 of the first center penetration patterns 50_H1 are greater than the spaced intervals P21 and P22 of the first edge penetration pattern 50_H2.

The plurality of lower electrodes 210 may include a plurality of first lower electrodes 210_1 and a plurality of second lower electrodes 210_2. The plurality of first lower electrodes 210_1 may come into contact with the center region 50_CEN of the first electrode support 50. The plurality of second lower electrodes 210_2 may come into contact with the edge region 50_EDGE of the first electrode support 50.

For example, each first center penetration pattern 50_H1 may be formed over four first lower electrodes 210_1. The first edge penetration pattern 50_H2 may be formed over four second lower electrodes 210_2. Since the center region 50_CEN of the first electrode support 50 may include two or more first center penetration patterns 50_H1, the lower electrode 210 may include at least eight or more first lower electrodes 210_1. Since the edge region 50_EDGE of the first electrode support 50 may include two or more first edge penetration patterns 50_H2, the lower electrode 210 may include at least eight or more second lower electrodes 210_2. The first electrode support 50 may come into contact with at least sixteen or more lower electrodes 210.

A part of the lower electrode 210 may have a chamfered shape, in the portion in which the first center penetration pattern 50_H1 and the first edge penetration pattern 50_H2 are formed. In other words, a part of the lower electrode 210 may be recessed, in the portion in which the first center penetration pattern 50_H1 and the first edge penetration pattern 50_H2 are formed. In such a case, the upper surface 210_US of the lower electrode 210 may not include the chamfered portion.

Unlike the shown example, the lower electrode 210 may not have a chamfered shape in the portion in which the first center penetration pattern 50_H1 and the first edge penetration pattern 50_H2 are formed.

In FIGS. 3, 6 and 7, the first lower electrode 210_1 may include an upper portion 210UP_1 and a lower portion 210BP_1. The second lower electrode 210_2 may include an upper portion 210UP_2 and a lower portion 210BP_2.

Each of the upper portion 210UP_1 of the first lower electrode 210_1 and the upper portion 210UP_2 of the second lower electrode 210_2 may be portions that come into contact with the first electrode support 50. Each of the upper portion 210UP_1 of the first lower electrode 210_1 and the upper portion 210UP_2 of the second lower electrode 210_2 may include the upper surface 210_US of the lower electrode 210.

Each of the lower portion 210BP_1 of the first lower electrode 210_1 and the lower portion 210BP_2 of the second lower electrode 210_2 may be portions that come into contact with an etching stop film 165, which will be described later. Each of the lower portion 210BP_1 of the first lower electrode 210_1 and the lower portion 210BP_2 of the second lower electrode 210_2 may include a lower surface of the lower electrode 210 that comes into contact with (and is electrically connected to) a respective landing pad 160.

In the first lower electrode 210_1, a horizontal center 210UP_CL1 of the upper portion 210UP_1 of the first lower electrode 210_1 may be aligned with a horizontal center 210BP_CL1 of the lower portion 210BP_1 of the first lower electrode 210_1. That is, the center 210UP_CL1 of the upper portion 210UP_1 of the first lower electrode 210_1 and the center 210BP_CL1 of the lower portion 210BP_1 of the first lower electrode 210_1 may be aligned in the fourth direction DR4. The center 210UP_CL1 of the upper portion 210UP_1 of the first lower electrode 210_1 and the center 210BP_CL1 of the lower portion 210BP_1 of the first lower electrode 210_1 may lie on a single straight line (i.e., may be collinear).

In the second lower electrode 210_2, a center 210UP_CL2 of the upper portion 210UP_2 of the second lower electrode 210_2 may be misaligned with a center 210BP_CL2 of the lower portion 210BP_2 of the second lower electrode 210_2. That is, the center 210UP_CL2 of the upper portion 210UP_2 of the second lower electrode 210_2 may be spaced apart from the center 210BP_CL2 of the lower portion 210BP_2 of the second lower electrode 210_2 in a horizontal direction orthogonal to the fourth direction DR4. The center 210UP_CL2 of the upper portion 210UP_2 of the second lower electrode 210_2 and the center 210BP_CL2 of the lower portion 210BP_2 of the second lower electrode 210_2 do not lie on the single straight line (i.e., are not collinear).

The second lower electrode 210_2 may bend toward the center region 50_CEN of the first electrode support 50. In the single second lower electrode 210_2, at least a part of the second lower electrode 210_2 (e.g., an upper portion of the second lower electrode 210_2 that is in contact with the edge region 50_EDGE) may bend toward the center of the first electrode support 50. For example, the degree to which the second lower electrode 210_2 bends may decrease, as it moves toward the center of the first electrode support 50. That is, when a portion of the second lower electrode 210_2 adjacent to the first side wall 50_SA of the first electrode support 50 and/or the second side wall 50_SB of the first electrode support 50 bends by a first size, a portion of the second lower electrode 210_2 adjacent to the center of the first electrode support 50 may bend by a second size smaller than the first size.

The second lower electrode 210_2 is affected by the surrounding environment of the first capacitor block CAP_ST1 (e.g., a substance, an interval between patterns, etc.), and may bend toward the vicinity of the center of the first electrode support 50. However, the influence of the surrounding environment of the first capacitor block CAP_ST1 decreases, going away from the first side wall 50_SA of the first electrode support 50 and/or the second side wall 50_SB of the first electrode support 50.

A portion of the first lower electrode 210_1 that comes into contact with the center region 50_CEN of the first electrode support 50 may not be affected (or may be affected to only a small extent) by the surrounding environment of the first capacitor block CAP_ST1. As a result, the center 210UP_CL1 of the upper portion 210UP_1 of the first lower electrode 210_1 may be aligned with the center 210BP_CL1 of the lower portion 210BP_1 of the first lower electrode 210_1.

Since a portion of the second lower electrode 210_2 that comes into contact with the edge region 50_EDGE of the first electrode support 50 bends toward the vicinity of the center of the first electrode support 50, it may be beneficial to adjust the third interval P21 and the fourth interval P22 differently from the first interval P11 and the second interval P12.

One first edge penetration pattern 50_H2 and four lower electrodes 210 around the first edge penetration pattern 50_H2 will be described as an example. If the third interval P21 and the fourth interval P22 are the same as the first interval P11 and the second interval P12, the first edge penetration pattern 50_H2 may be formed to be biased toward at least one of the four lower electrodes 210. In such a case, an electric field may be concentrated on at least one of the four lower electrodes 210, while the first capacitor block CAP_ST1 is operating. In the vicinity of the lower electrode 210 on which the electric field is concentrated, a defect may occur in the first capacitor block CAP_ST1. Such a defective capacitor block may reduce the performance and reliability of the semiconductor device.

The second electrode support 60 may be disposed between the substrate 100 and the first electrode support 50. The second electrode support 60 may have a plate-like shape extending in a direction parallel to the upper surface of the substrate 100.

The second electrode support 60 may come into contact with the side walls of the lower electrode 210. The second electrode support 60 may support a plurality of lower electrodes 210.

The second electrode support 60 may include a plurality of second penetration patterns 60_H1 and 60_H2 that penetrate the second electrode support 60. The second penetration patterns 60_H1 and 60_H2 may include a plurality of second center penetration patterns 60_H1 and a plurality of second edge penetration patterns 60_H2.

The second penetration patterns 60_H1 and 60_H2 may be formed at positions corresponding to the first penetration patterns 50_H1 and 50_H2. The second penetration patterns 60_H1 and 60_H2 may be overlapped by (i.e., may underlie) and/or connected to the first penetration patterns 50_H1 and 50_H2 in the fourth direction DR4.

The second electrode support 60 may include, for example, at least one of silicon nitride (SiN), silicon carbonitride (SiCN), silicon boronitride (SiBN), silicon oxycarbide (SiOC), silicon oxynitride (SiON), silicon oxide (SiO), and silicon oxyarbonitride (SiOCN).

Unlike the shown example, in an example, the first capacitor block CAP_ST1 may not include the second electrode support 60. As another example, the first capacitor block CAP_ST1 may further include an additional electrode support between the substrate 100 and the first electrode support 50.

The capacitor dielectric film 211 may be formed on the plurality of lower electrodes 210, the first electrode support 50, and the second electrode support 60. The capacitor dielectric film 211 may extend along the profile of the lower electrode 210, the upper surface 50_US of the first electrode support 50 and the lower surface of the first electrode support 50, and the upper surface of the second electrode support 60 and the lower surface of the second electrode support 60. The capacitor dielectric film 211 may include, for example, but is not limited to, at least one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. Although the capacitor dielectric film 211 is shown as a single film, this is only for convenience of explanation, and the present invention is not limited thereto.

In the semiconductor device according to some embodiments, the capacitor dielectric film 211 may include a stacked film structure in which zirconium oxide, aluminum oxide, and zirconium oxide are sequentially stacked.

In the semiconductor device according to some embodiments, the capacitor dielectric film 211 may include a dielectric film including hafnium (Hf). In the semiconductor device according to some embodiments, the capacitor dielectric film 211 may have a stacked film structure of a ferroelectric material film and a paraelectric material film.

The ferroelectric material film may have ferroelectric properties. The ferroelectric material film may have a thickness to such an extent that it has ferroelectric properties. A thickness range of the ferroelectric material film having the ferroelectric properties may vary depending on the ferroelectric material.

For example, the ferroelectric material film may include a monometal oxide. The ferroelectric material film may include a monometal oxide film. Here, the monometal oxide may be a binary compound made up of one metal and oxygen. The ferroelectric material film including the monometal oxide may have an orthorhombic crystal structure.

As an example, the metal included in the monometal oxide film may be hafnium (Hf). The monometal oxide film may be a hafnium oxide (HfO) film. Here, the hafnium oxide film may have a chemical formula suitable for stoichiometry, or may have a chemical formula that is not suitable for stoichiometry.

As another example, the metal included in the monometal oxide film may be a rare earth metal belonging to lanthanoids. The monometal oxide film may be a rare earth metal oxide film belonging to the lanthanoids. Here, the rare earth metal oxide film belonging to the lanthanoids may have a chemical formula suitable for stoichiometry or may have a chemical formula that is not suitable for stoichiometry. When the ferroelectric material film includes the monometal oxide film, the ferroelectric material film may have a thickness of, for example, 1 nanometer (nm) or more and 10 nm or less.

For example, the ferroelectric material film may include a bimetal oxide. The ferroelectric material film may include a bimetal oxide film. Here, the bimetal oxide may be a ternary compound made up of two metals and oxygen. The ferroelectric material film including the bimetal oxide may have an orthorhombic crystal structure.

The metal included in the bimetal oxide film may be, for example, hafnium (Hf) and zirconium (Zr). The bimetal oxide film may be a hafnium zirconium oxide film ($Hf_xZr_{r(1-x)}O$). In the bimetal oxide film, x may be 0.2 or more and 0.8 or less. Here, the hafnium zirconium oxide film ($Hf_xZr_{r(1-x)}O$) may have a chemical formula suitable for stoichiometry, or may have a chemical formula not suitable for stoichiometry.

When the ferroelectric material film includes a bimetal oxide film, the ferroelectric material film may have a thickness of, for example, 1 nm or more and 20 nm or less.

For example, the paraelectric material film may be, but is not limited to, a dielectric film including zirconium (Zr) or a stacked film including zirconium (Zr). Even if the chemical formula is the same, the ferroelectric properties may be exhibited or the paraelectric properties may be exhibited, depending on the crystal structure of the dielectric substance.

The paraelectric material has a positive dielectric constant, and the ferroelectric material may have a negative dielectric constant in a fixed interval. That is, the paraelectric material may have a positive capacitance, and the ferroelectric material may have a negative capacitance.

In general, when two or more capacitors having positive capacitance are connected in series, the sum of the capacitances decreases. However, when a negative capacitor having a negative capacitance and a positive capacitor having a positive capacitance are connected in series, the sum of capacitances increases.

The upper electrode 212 may be formed on the capacitor dielectric film 211. The upper electrode 212 may include, for example, but is not limited to, a doped semiconductor material, a conductive metal nitride (e.g., titanium nitride, tantalum nitride, niobium nitride or tungsten nitride, etc.), a metal (e.g., ruthenium, iridium, titanium, or tantalum, etc.), or a conductive metal oxide (e.g., iridium oxide or niobium oxide, etc.). The upper electrode 212 is shown as a single film, this is only for convenience of explanation, and the present invention is not limited thereto.

Hereinafter, a lower structure connected to the first capacitor block CAP_ST1 will be described.

The substrate 100 may include a cell region, and a core/peri region located around the cell region.

A cell element separation film 105 may be formed inside the substrate 100 of the cell region. The cell element separation film 105 may have an STI (shallow trench isolation) structure having excellent element separation characteristics. The cell element separation film 105 may define a cell active region inside the cell region.

The cell element separation film 105 may include, for example, but is not limited to, at least one of a silicon oxide film, a silicon nitride film, and a silicon oxynitride film. In FIGS. 3, 4, and 6, although the cell element separation film 105 is shown to be formed of a single insulating film, this is only for convenience of explanation, and the present invention is not limited thereto. Depending on the width of the cell element separation film 105, the cell element separation film 105 may be formed of a single insulating film or may be formed of a plurality of insulating films.

Although the upper surface of the cell element separation film 105 and the upper surface of the substrate 100 are shown as being disposed on the same plane, this is only for convenience of explanation, and the present invention is not limited thereto.

A cell gate structure 110 may be formed inside the substrate 100 and the cell element separation film 105. The cell gate structure 110 may be formed across the cell element separation film 105 and the cell active region defined by the cell element separation film 105. The cell gate structure 110 may include a cell gate trench 115, a cell gate insulating film 111, a cell gate electrode 112, a cell gate capping pattern 113, and a cell gate capping conductive film 114 that are formed inside the substrate 100 and the cell element separation film 105. For example, when the semiconductor device includes a DRAM, the cell gate electrode 112 may correspond to a word line. Unlike the shown example, the cell gate structure 110 may not include the cell gate capping conductive film 114.

The cell gate insulating film 111 may extend along the side walls and the bottom surface of the cell gate trench 115. The cell gate insulating film 111 may extend along a profile of at least a part of the cell gate trench 115. The cell gate insulating film 111 may include, for example, at least one of silicon oxide, silicon nitride, silicon oxynitride, or a high dielectric constant material having a higher dielectric constant than silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The cell gate electrode 112 may be formed on the cell gate insulating film 111. The cell gate electrode 112 may extend long in the first direction DR1. The cell gate electrode 112 may fill a part of the cell gate trench 115. The cell gate capping conductive film 114 may extend along the upper surface of the cell gate electrode 112.

The cell gate electrode 112 may include at least one of a metal, a metal alloy, a conductive metal nitride, a conductive metal carbonitride, a conductive metal carbide, a metal silicide, a doped semiconductor material, a conductive metal oxynitride, and a conductive metal oxide. The cell gate electrode 112 may include, for example, but is not limited to, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx and combinations thereof. The cell gate capping conductive film 114 may include, but is not limited to, for example, polysilicon or polysilicon-germanium.

The cell gate capping pattern 113 may be disposed on the cell gate electrode 112 and the cell gate capping conductive film 114. The cell gate capping pattern 113 may fill the cell gate trench 115 that remains after the cell gate electrode 112 and the cell gate capping conductive film 114 are formed. Although the cell gate insulating film 111 is shown to extend along the side walls of the cell gate capping pattern 113, the present invention is not limited thereto. The cell gate capping pattern 113 may include, for example, at least one of silicon nitride (SiN), silicon oxynitride (SiON), silicon oxide (SiO), silicon carbonitride (SiCN), silicon oxycarbonitride (SiOCN), and a combination thereof.

Although not shown, an impurity doping region may be formed on at least one side of the cell gate structure 110. The impurity doping region may be a source/drain region of the transistor.

A bit line structure 140ST may include a cell conductive line 140 and a cell line capping film 144. The cell conductive line 140 may be formed on the substrate 100 and the cell element separation film 105 on which the cell gate structure 110 is formed. The cell conductive line 140 may intersect the cell element separation film 105 and the cell active region defined by the cell element separation film 105. The cell conductive line 140 may be formed to intersect the cell gate structure 110. The cell conductive line 140 may extend long (i.e., longitudinally) in the second direction DR2. For example, when the semiconductor device includes a DRAM, the cell conductive line 140 may correspond to a bit line.

The cell conductive line 140 may be multiple films. The cell conductive line 140 may include, for example, a first cell conductive film 141, a second cell conductive film 142, and a third cell conductive film 143. The first to third cell conductive films 141, 142, and 143 may be sequentially stacked on the substrate 100 and the cell element separation film 105. Although the cell conductive line 140 is shown as a triple film, the present invention is not limited thereto.

The first to third cell conductive films 141, 142, and 143 may each include at least one of an impurity-doped semiconductor material, a conductive silicide compound, a conductive metal nitride metal, and a metal alloy. For example, although the first cell conductive film 141 may include a doped semiconductor material, the second cell conductive film 142 may include at least one of a conductive silicide compound and a conductive metal nitride, and the third cell conductive film 143 may include at least one of metal and metal alloy, the present invention is not limited thereto.

A bit line contact 146 may be formed between the cell conductive line 140 and the substrate 100. That is, the cell conductive line 140 may be formed on the bit line contact 146. The bit line contact 146 may be formed between the cell active region and the cell conductive line 140.

The bit line contact 146 may electrically connect the cell conductive line 140 and the substrate 100. Here, the bit line contact 146 may correspond to the direct contact of the DRAM. The bit line contact 146 may include, for example, at least one of an impurity-doped semiconductor material, a conductive silicide compound, a conductive metal nitride, and a metal.

In FIGS. 3 and 6, in a region in which it overlaps the upper surface of the bit line contact 146, the cell conductive line 140 may include a second cell conductive film 142 and a third cell conductive film 143. In a region in which it does not overlap the upper surface of the bit line contact 146, the cell conductive line 140 may include the first to third cell conductive films 141, 142 and 143.

The cell line capping film 144 may be disposed on the cell conductive line 140. The cell line capping film 144 may extend in the second direction D2 along the upper surface of the cell conductive line 140. In some embodiments, the cell line capping film 144 may include, for example, at least one of a silicon nitride film, a silicon oxynitride, a silicon carbonitride, and a silicon oxycarbonitride. Although the cell line capping film 144 is shown as a single film, the present invention is not limited thereto. Unlike the shown example, as an example, the cell line capping film 144 may have a double film structure. As another example, the cell line capping film 144 may have a triple film structure. As still another example, the cell line capping film 144 may have a structure of a quadruple film or more.

The cell insulating film 130 may be formed on the substrate 100 and the cell element separation film 105. More specifically, the cell insulating film 130 may be formed on a portion of the substrate 100 and the cell element separation film 105 on which the bit line contact 146 and the storage contact 120 are not formed. The cell insulating film 130 may be formed between the substrate 100 and the cell conductive line 140, and between the cell element separation film 105 and the cell conductive line 140.

Although the cell insulating film 130 may be a single film, as shown, the cell insulating film 130 may be a multiple film including the first cell insulating film 131 and the second cell insulating film 132. For example, although the first cell insulating film 131 may include a silicon oxide film, and the second cell insulating film 132 may include a silicon nitride film, the present invention is not limited thereto. Unlike the shown example, the cell insulating film 130 may be, but is not limited to, a triple film including a silicon oxide film, a silicon nitride film and a silicon oxide film.

The cell line spacer 150 may be disposed on the side walls of the cell conductive line 140 and the cell line capping film 144. In a portion of the cell conductive line 140 in which the bit line contact 146 is formed, the cell line spacer 150 may be formed on the substrate 100 and the cell element separation film 105. The cell line spacer 150 may be disposed on the side walls of the cell conductive line 140, the cell line capping film 144, and the bit line contact 146.

However, in a remaining portion of the cell conductive line 140 in which the bit line contact 146 is not formed, the cell line spacer 150 may be disposed on the cell insulating film 130. The cell line spacer 150 may be disposed on the side walls of the cell conductive line 140 and the cell line capping film 144.

Although the cell line spacer 150 may be a single film, as shown, the cell line spacer 150 may be multiple films including the first to fourth cell line spacers 151, 152, 153, and 154. For example, the first to fourth cell line spacers 151, 152, 153, and 154 may include, but are not limited to, one of a silicon oxide film, a silicon nitride film, a silicon oxynitride film (SiON), a silicon oxycarbonitride film (SiOCN), air, and combinations thereof. For example, the second cell line spacer 152 is not disposed on the cell insulating film 130, but may be disposed on the side walls of the bit line contact 146.

A fence pattern 170 may be disposed on the substrate 100 and the cell element separation film 105. The fence pattern 170 may be formed to overlap the cell gate structure 110 formed inside the substrate 100 and the cell element separation film 105. The fence pattern 170 may be disposed between the bit line structures 140ST extending in the second direction D2. The fence pattern 170 may include, for example, at least one of silicon oxide, silicon nitride, silicon oxynitride, and combinations thereof.

The storage contact 120 may be disposed between the cell conductive lines 140 adjacent to each other in the first direction D1. The storage contacts 120 may be disposed between the fence patterns 170 adjacent to each other in the second direction D2. The storage contact 120 may overlap the substrate 100 and the cell element separation film 105 between the adjacent cell conductive lines 140. The storage contact 120 may be connected to the cell active region. Here, the storage contact 120 may correspond to the buried contact of the DRAM.

The storage contact 120 may include, for example, at least one of an impurity-doped semiconductor material, a conductive silicide compound, a conductive metal nitride, and a metal.

The landing pad 160 may be formed on the storage contact 120. The landing pad 160 may be electrically connected to the storage contact 120. The landing pad 160 may be connected to the cell active region.

The landing pad 160 may overlap a part of the upper surface of the bit line structure 140ST. The landing pad 160 may include, for example, at least one of an impurity-doped semiconductor material, a conductive silicide compound, a conductive metal nitride, a conductive metal carbide, a metal, and a metal alloy.

A pad separation insulating film 180 may be formed on the landing pad 160 and the bit line structure 140ST. For example, the pad separation insulating film 180 may be disposed on the cell line capping film 144. The pad separation insulating film 180 may define the landing pad 160 that forms a plurality of isolation regions. The pad separation insulating film 180 may not cover the upper surface of the landing pad 160. For example, a height of the upper surface 160US of the landing pad 160 may be the same as a height of the upper surface of the pad separation insulating film 180, relative to the upper surface of the substrate 100.

The pad separation insulating film 180 includes an insulating material, and may electrically separate a plurality of landing pads 160 from each other. For example, the pad separation insulating film 180 may include, for example, at least one of a silicon oxide film, a silicon nitride film, a silicon oxynitride film, a silicon oxycarbonitirde film, and a silicon carbonitride film.

The etching stop film 165 may be disposed on the upper surface 160US of the landing pad and the upper surface of the pad separation insulating film 180. The etching stop film 165 may include, for example, at least one of silicon nitride (SiN), silicon carbonitride (SiCN), silicon oxycarbonitride (SiOCN), silicon oxycarbide (SiOC), and silicon boronitride (SiBN).

In FIGS. 3, 4 and 6, the landing pad 160 may include, for example, a first landing pad and a second landing pad that are spaced apart from each other. The first landing pad and the second landing pad are not electrically connected to each other, but may be electrically connected to a first lower electrode 210_1 and a second lower electrode 210_2, respectively, without being electrically connected to the second lower electrode 210_2 and the first lower electrode 210_1, respectively.

The lower electrode 210 may include a first sub-lower electrode and a second sub-lower electrode that are spaced apart from each other. The first sub-lower electrode and the second sub-lower electrode may each extend long (i.e., longitudinally) in the fourth direction DR4. The first sub-lower electrode and the second sub-lower electrode are not electrically connected to each other. The first sub-lower electrode and the second sub-lower electrode penetrate the etching stop film 165 and are connected to the landing pad 160.

In the semiconductor device according to some embodiments, the first landing pad is connected to the first sub-lower electrode, but is not connected to the second sub-lower electrode. The second landing pad is connected to the second sub-lower electrode, but is not connected to the first sub-lower electrode.

For example, the first capacitor block CAP_ST1 may be a capacitor disposed in the memory cell region of the memory element. The first capacitor block CAP_ST1 includes a plurality of capacitors, each of which operates separately. The capacitor including the first sub-lower electrode may operate separately from the capacitor including the second sub-lower electrode.

Figure 8:
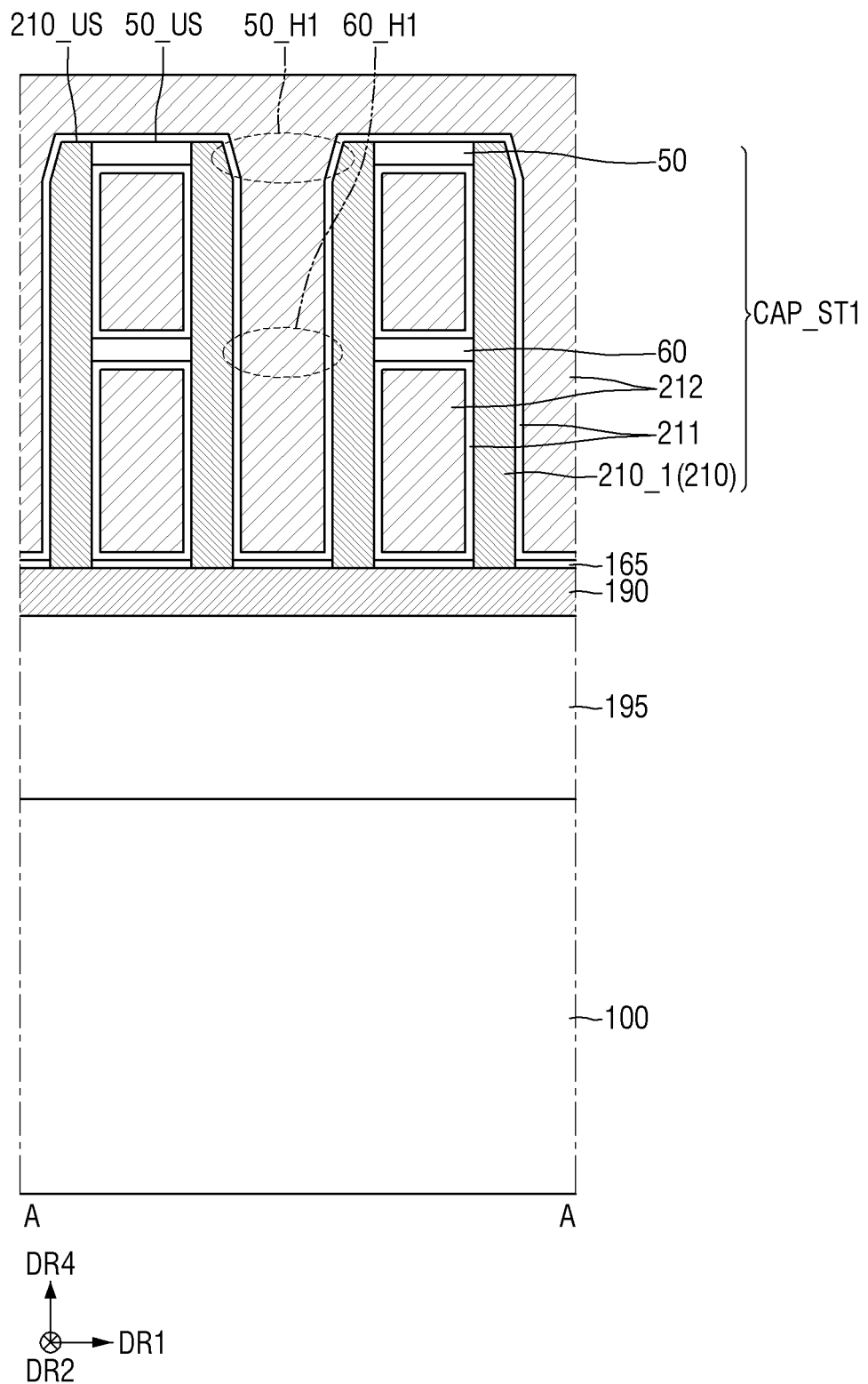
FIGS. 8 and 9 are cross-sectional diagrams for explaining a semiconductor device according to some embodiments.
Figure 9:
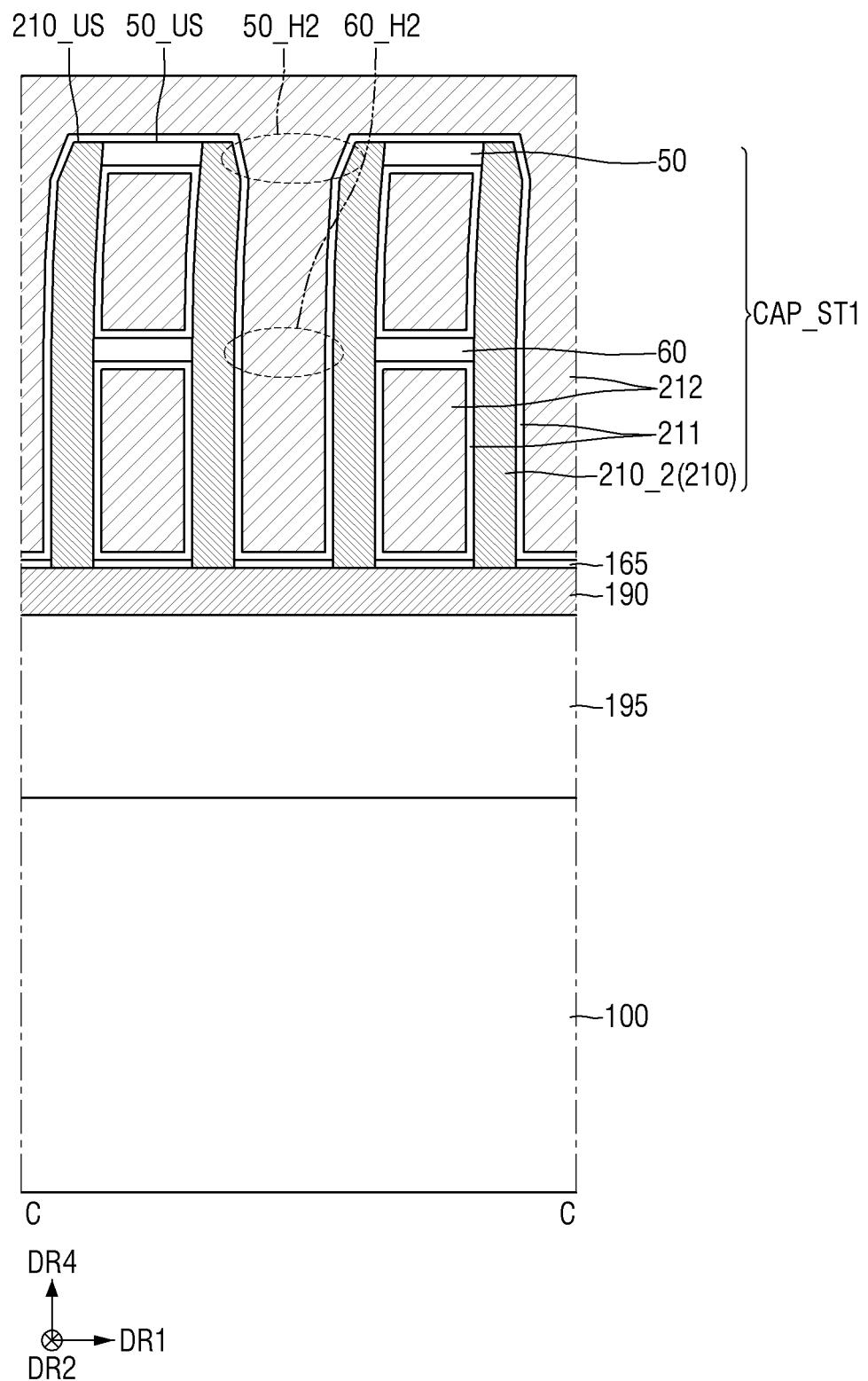

FIGS. 8 and 9 are diagrams for explaining a semiconductor device according to some embodiments. For convenience of explanation, points different from those described using FIGS. 1 to 7 will be mainly described.

For reference, FIG. 8 may be an example cross-sectional view taken along A-A of FIG. 2, and FIG. 9 may be an example cross-sectional view taken along C-C of FIG. 5.

Referring to FIGS. 8 and 9, the semiconductor device according to some embodiments may further include a plate lower electrode 190 disposed between the substrate 100 and the plurality of lower electrodes 210.

A peri interlayer insulating film 195 may be disposed on the substrate 100. The peri interlayer insulating film 195 may include, for example, at least one of silicon nitride (SiN), silicon carbonitride (SiCN), silicon boronitride (SiBN), silicon oxycarbide (SiOC), silicon oxynitride (SiON), silicon oxide (SiO), silicon oxyarbonitride (SiOCN) and combinations thereof. For example, silicon oxycarbide (SiCO) includes silicon (Si), carbon (C) and oxygen (O), but does not require a particular ratio between silicon (Si), carbon (C) and oxygen (O).

The plate lower electrode 190 may be disposed on the peri interlayer insulating film 195. The plate lower electrode 190 may have a plate-like shape extending in a direction parallel to the upper surface of the substrate 100.

A plurality of lower electrodes 210 may be disposed on the plate lower electrode 190. Each lower electrode 210 may be connected to the plate lower electrode 190. For example, each lower electrode 210 may be electrically connected to the plate lower electrode 190.

Each first lower electrode 210_1 that comes into contact with the center region 50_CEN of the first electrode support 50 may be connected to the plate lower electrode 190. Moreover, each second lower electrode 210_2 that comes into contact with the edge region 50_EDGE of the first electrode support 50 may be connected to the plate lower electrode 190. In some embodiments, a part of the second lower electrode 210_2 that comes into contact with the edge region 50_EDGE of the first electrode support 50 may be connected to the plate lower electrode 190. The rest of the second lower electrode 210_2 is not connected to the plate lower electrode 190.

The plate lower electrode 190 may include, for example, at least one of an impurity-doped semiconductor material, a conductive silicide compound, a conductive metal nitride, and a metal.

When the first capacitor block CAP_ST1 is included in the memory device, the first capacitor block CAP_ST1 may be, for example, a capacitor disposed in the core/peri region. The first capacitor block CAP_ST1 may be a single capacitor. Alternatively, the plurality of lower electrodes 210 connected to the plate lower electrode 190 may operate like a single electrode.

Figure 10:
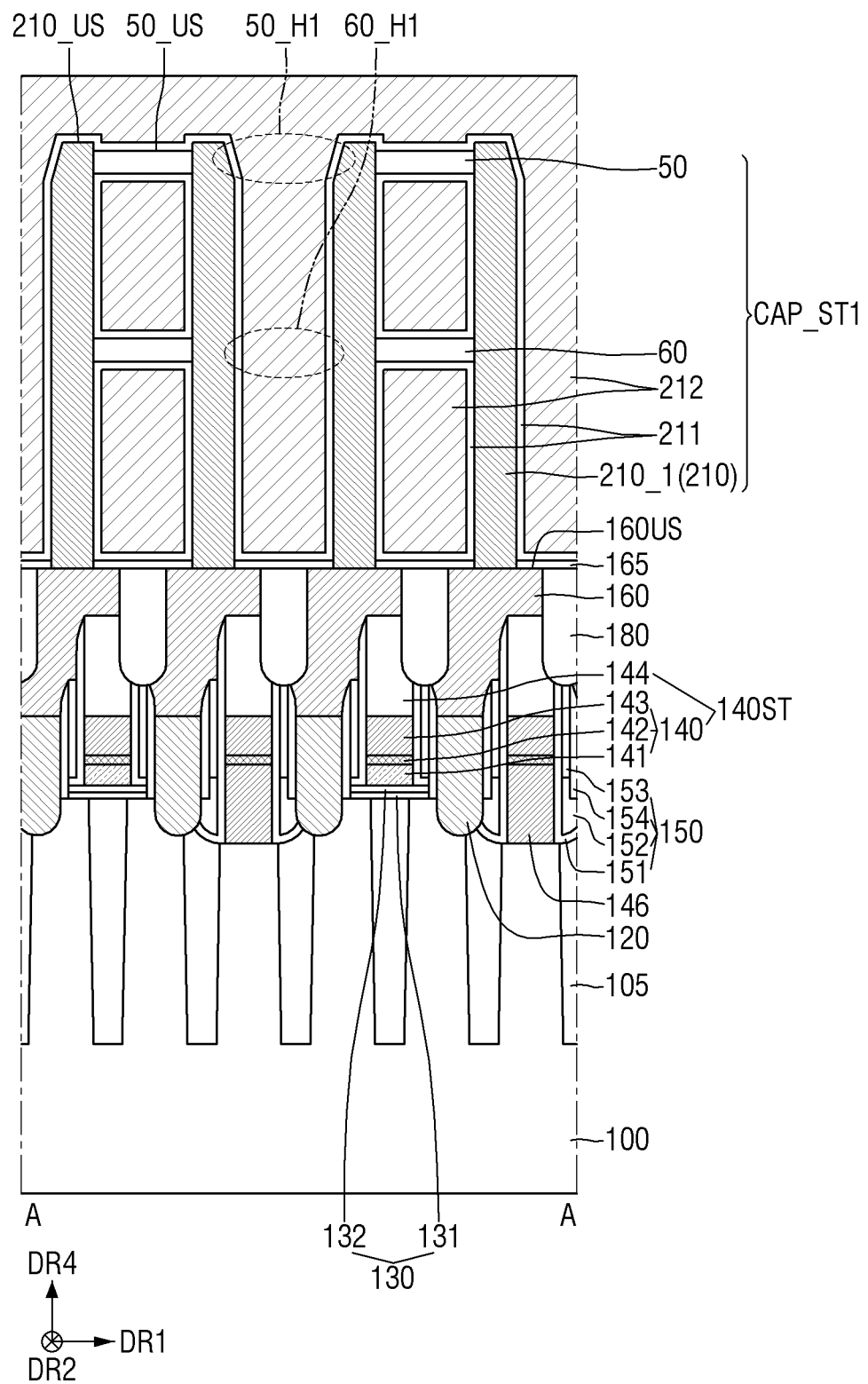
FIG. 10 is a cross-sectional diagram for explaining a semiconductor device according to some embodiments.
Figure 11:
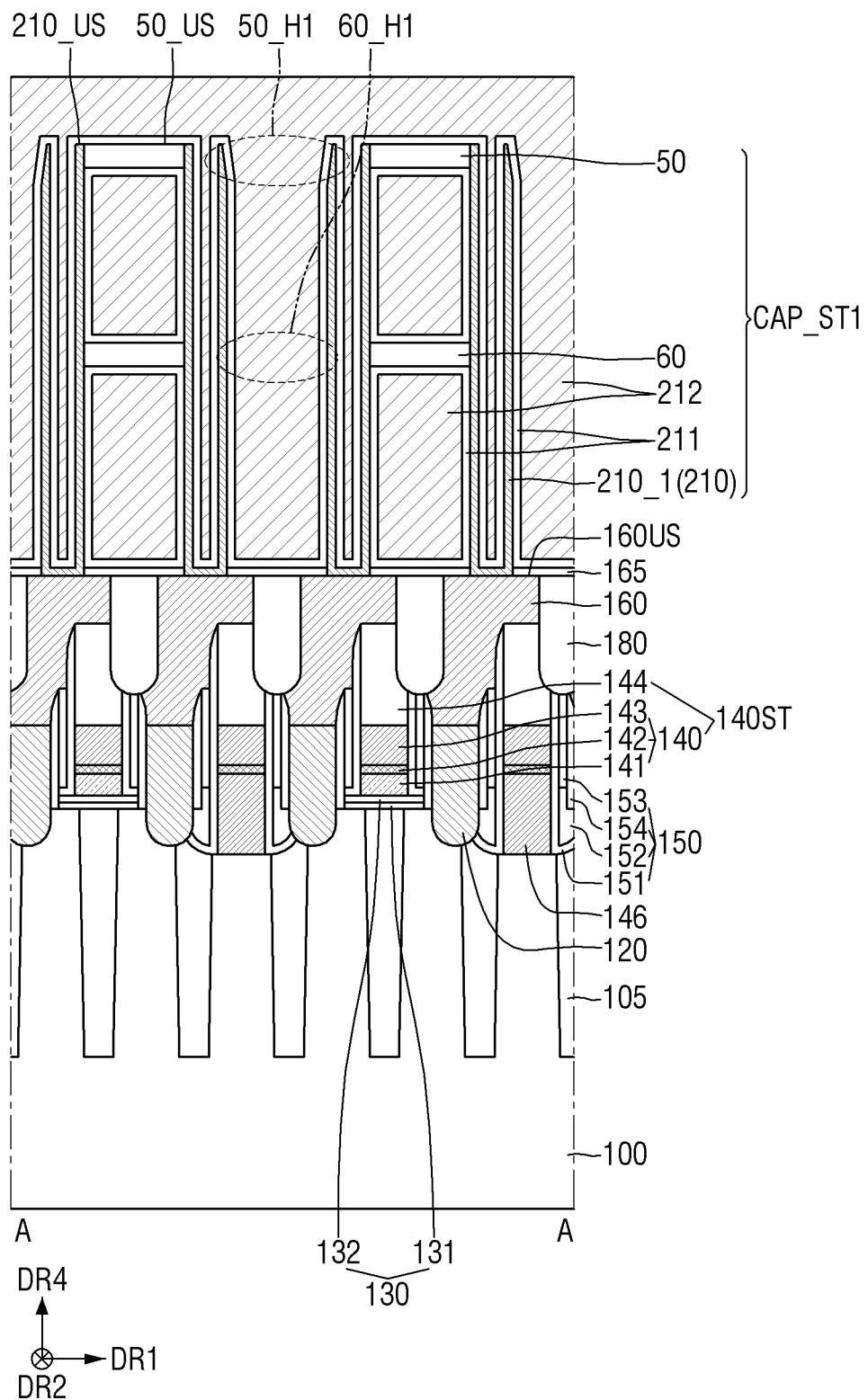
FIG. 11 is a cross-sectional diagram for explaining the semiconductor device according to some embodiments.

FIG. 10 is a diagram for explaining a semiconductor device according to some embodiments. FIG. 11 is a diagram for explaining the semiconductor device according to some embodiments. For convenience of explanation, points different from those described using FIGS. 1 to 7 will be mainly described.

Referring to FIG. 10, in the semiconductor device according to some embodiments, a part of the lower electrode 210 may protrude upward from/beyond the upper surface 50_US of the first electrode support 50.

The upper surface 50_US of the first electrode support 50 is not located on the same plane as the upper surface 210_US of the lower electrode. Relative to the upper surface of the substrate 100, the upper surface 50_US of the first electrode support 50 is lower than the upper surface 210_US of the lower electrode 210 in FIG. 10.

Referring to FIG. 11, in the semiconductor device according to some embodiments, the lower electrode 210 may have a cylinder form.

The lower electrode 210 may include a bottom portion extending along the upper surface of the landing pad 160, and side wall parts extending from the bottom portion in the fourth direction DR4.

Figure 12:
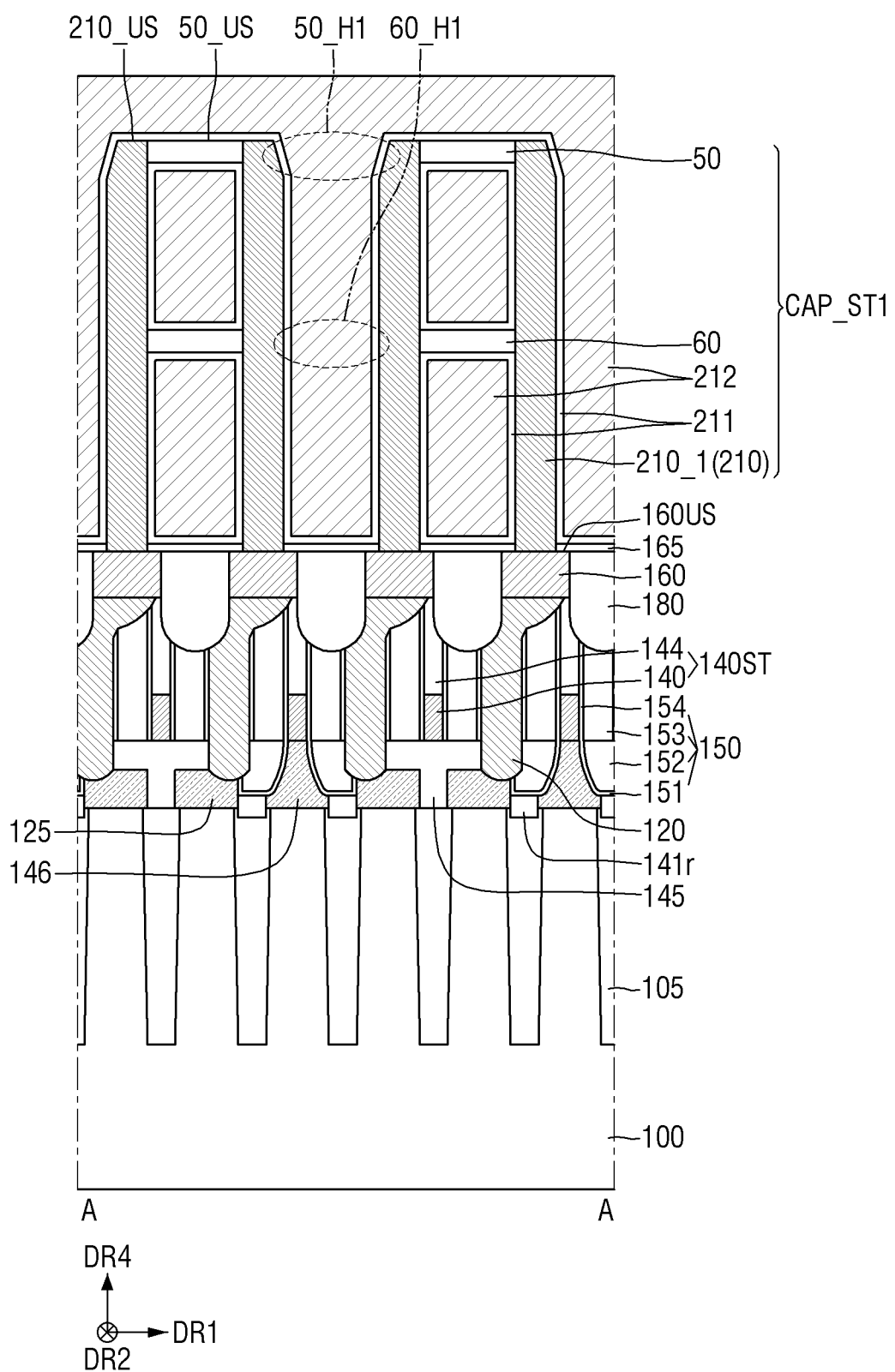
FIG. 12 is a cross-sectional diagram for explaining a semiconductor device according to some embodiments.

FIG. 12 is a diagram for explaining a semiconductor device according to some embodiments. For convenience of explanation, points different from those described using FIGS. 1 to 7 will be mainly described.

Referring to FIG. 12, the semiconductor device according to some embodiments may further include a node pad 125.

The bit line contact 146 includes an upper surface connected to the cell conductive line 140, and a lower surface connected to the cell active region of the substrate 100. A width of the upper surface of the bit line contact 146 in the first direction DR1 may be smaller than the width of the lower surface of the bit line contact 146 in the first direction DR1. The width of the bit line contact 146 may gradually increase as it goes away from the cell conductive line 140. That is, the bit line contact 146 may have a gradually wider width from the upper portion to the lower portion.

The node pad 125 may be disposed on the substrate 100. The node pad 125 may be disposed on the cell active region. The node pad 125 may be disposed between the storage contact 120 and the substrate 100.

The upper surface of the node pad 125 may be lower than the upper surface of the bit line contact 146 relative to the upper surface of the cell element separation film 105. The upper surface of the node pad 125 may be lower than the lower surface of the cell conductive line 140 relative to the upper surface of the cell element separation film 105.

A contact separation pattern 141r may be interposed between the bit line contact 146 and the node pad 125 adjacent thereto. The contact separation pattern 141r may include an insulating material.

The node separation pattern 145 may be interposed between adjacent node pads 125. The node separation pattern 145 is disposed on the substrate 100. The node separation pattern 145 may separate the adjacent node pads 125 in the first direction DR1. The node separation pattern 145 may cover the upper surface of the node pads 125 adjacent to each other in the first direction DR1. In the cross-sectional view, the node separation pattern 145 may have a "T" shape.

The upper surface of the node separation pattern 145 may be coplanar with the upper surface of the bit line contact 146. The upper surface of the node separation pattern 145 may be located at the same height as the upper surface of the bit line contact 146 relative to the upper surface of the cell element separation film 105. The upper surface of the node separation pattern 145 may be located at the same height as the lower surface of the cell conductive line 140 relative to the upper surface of the cell element separation film 105.

The node separation pattern 145 may include, for example, an insulating material. The lower surface of the node separation pattern 145 may be located at the same height as the upper surface of the cell element separation film 105, but is not limited thereto. The lower surface of the node separation pattern 145 may be lower than the upper surface of the cell element separation film 105.

The stacked structure of the cell conductive line 140 in the region in which it overlaps the upper surface of the bit line contact 146 may be the same as the stacked structure of the cell conductive line 140 in the region in which it does not overlap the upper surface of the bit line contact 146.

The storage contact 120 is connected to the node pad 125. The storage contact 120 connects the node pad 125 and the landing pad 160.

Figure 13:
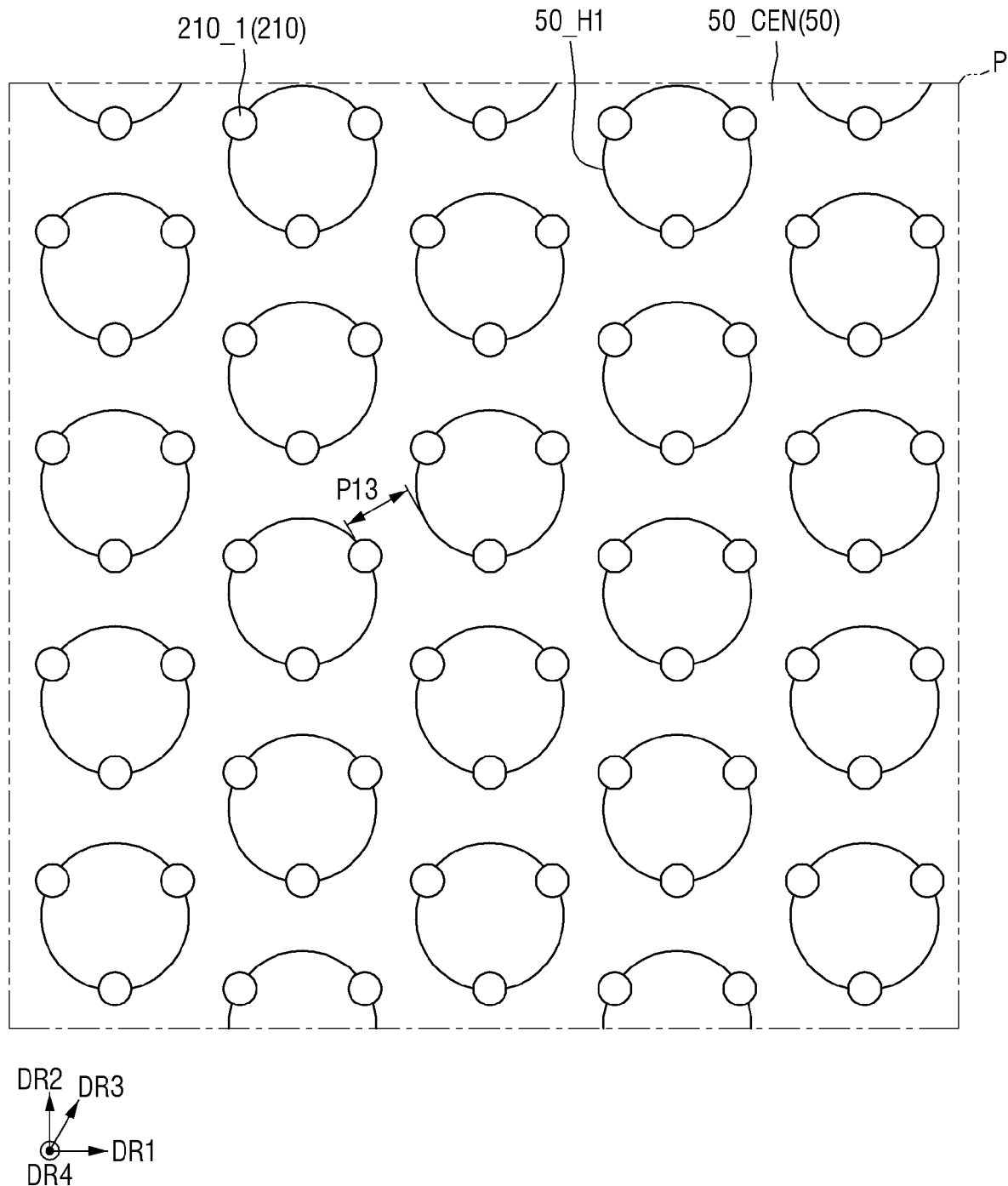
FIGS. 13-15 are enlarged plan views of the portion P of FIG. 1 according to some embodiments.
Figure 14:
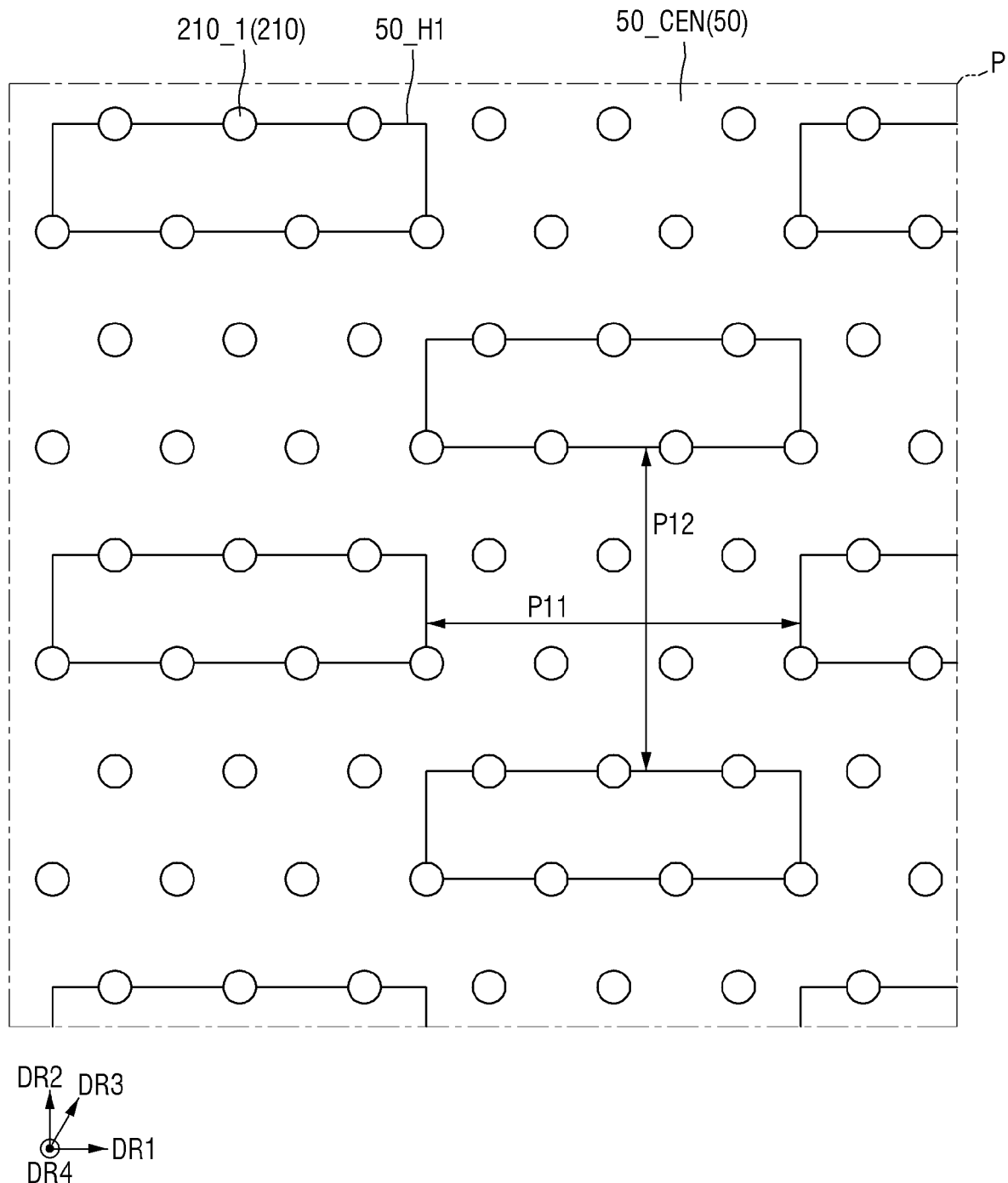
Figure 15:
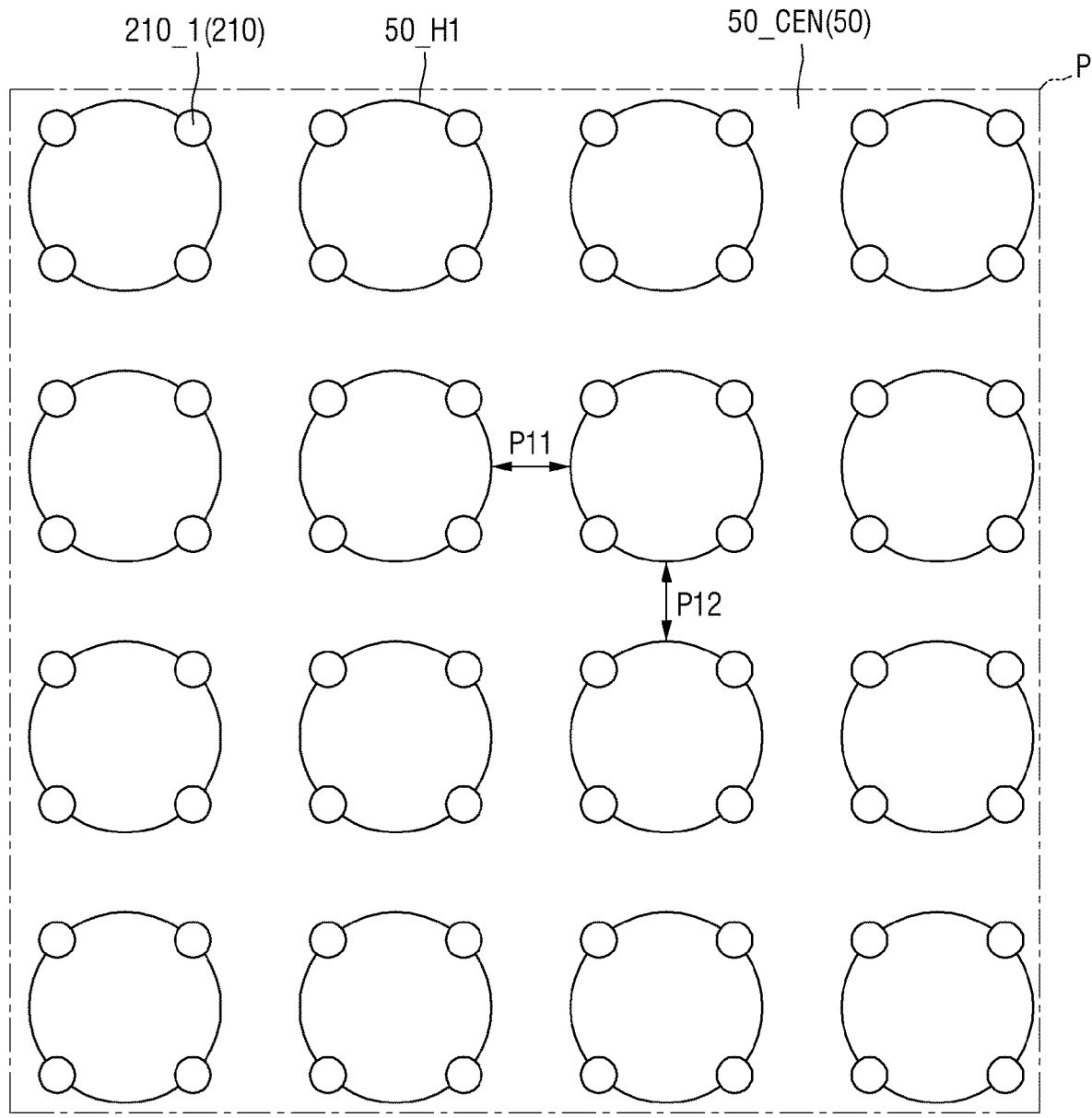

FIG. 13 is a diagram for explaining the semiconductor device according to some embodiments. FIG. 14 is a diagram for explaining the semiconductor device according to some embodiments. FIG. 15 is a diagram for explaining the semiconductor device according to some embodiments. For convenience of explanation, points different from those described using FIGS. 1 to 7 will be mainly described.

For reference, FIGS. 13 to 15 are enlarged views of a portion P of FIG. 1, respectively.

Referring to FIG. 13, in a semiconductor device according to some embodiments, the first center penetration pattern 50_H1 may be formed between three adjacent first lower electrodes 210_1. The first center penetration pattern 50_H1 may expose the three adjacent first lower electrodes 210_1.

Three first lower electrodes 210_1 that intersect one first center penetration pattern 50_H1 may be disposed at apex positions of a triangle. A fourth first lower electrode 210_1 is not disposed in the first center penetration pattern 50_H1.

Although not shown, an enlarged plan view of the portion Q of FIG. 1 may be similar to that of FIG. 13.

The adjacent first center penetration patterns 50_H1 may be spaced apart by a fifth interval P13. The first edge penetration patterns 50_H2 included in the edge region of the first electrode support (50_EDGE of FIG. 1) are spaced apart by an interval smaller than the fifth interval P13.

Referring to FIG. 14, in the semiconductor device according to some embodiments, the first center penetration pattern 50_H1 may have the form of a bar extending long in the first direction DR1.

Although the first center penetration pattern 50_H1 is shown to be formed over three first lower electrodes 210 adjacent to each other in a first row in the first direction DR1 and four first lower electrodes 210 adjacent to each other in a second row in the first direction DR1, this is only for convenience of explanation, and the present invention is not limited thereto.

Although not shown, an enlarged plan view of a portion Q of FIG. 1 may also be similar to that of FIG. 14.

As described using FIGS. 1 to 7, the intervals P11 and P12 by which the first center penetration patterns 50_H1 adjacent to each other are spaced apart from each other in the center region 50_CEN of the first electrode support 50 are greater than the intervals P21 and P22 by which the first edge penetration patterns 50_H2 adjacent to each other are spaced apart from each other in the edge region 50_EDGE of the first electrode support 50.

Referring to FIG. 15, in the semiconductor device according to some embodiments, the first lower electrodes 210_1 repeatedly arranged/aligned in the second direction DR2 may be linearly arranged along the second direction DR2.

The first lower electrodes 210_1 repeatedly arranged/aligned in the first direction DR1 may be arranged along the first direction DR1. Further, the first lower electrodes 210_1 repeatedly arranged/aligned in the second direction DR2 may be arranged along the second direction DR2.

Although not shown, an enlarged plan view of the portion Q of FIG. 1 may also be similar to that of FIG. 15.

As described using FIGS. 1 to 7, the intervals P11 and P12 by which the first center penetration patterns 50_H1 adjacent to each other are spaced apart from each other in the center region 50_CEN of the first electrode support 50 are greater than the intervals P21 and P22 by which the first edge penetration patterns 50_H2 adjacent to each other are spaced apart from each other in the edge region 50_EDGE of the first electrode support 50.

Figure 16:
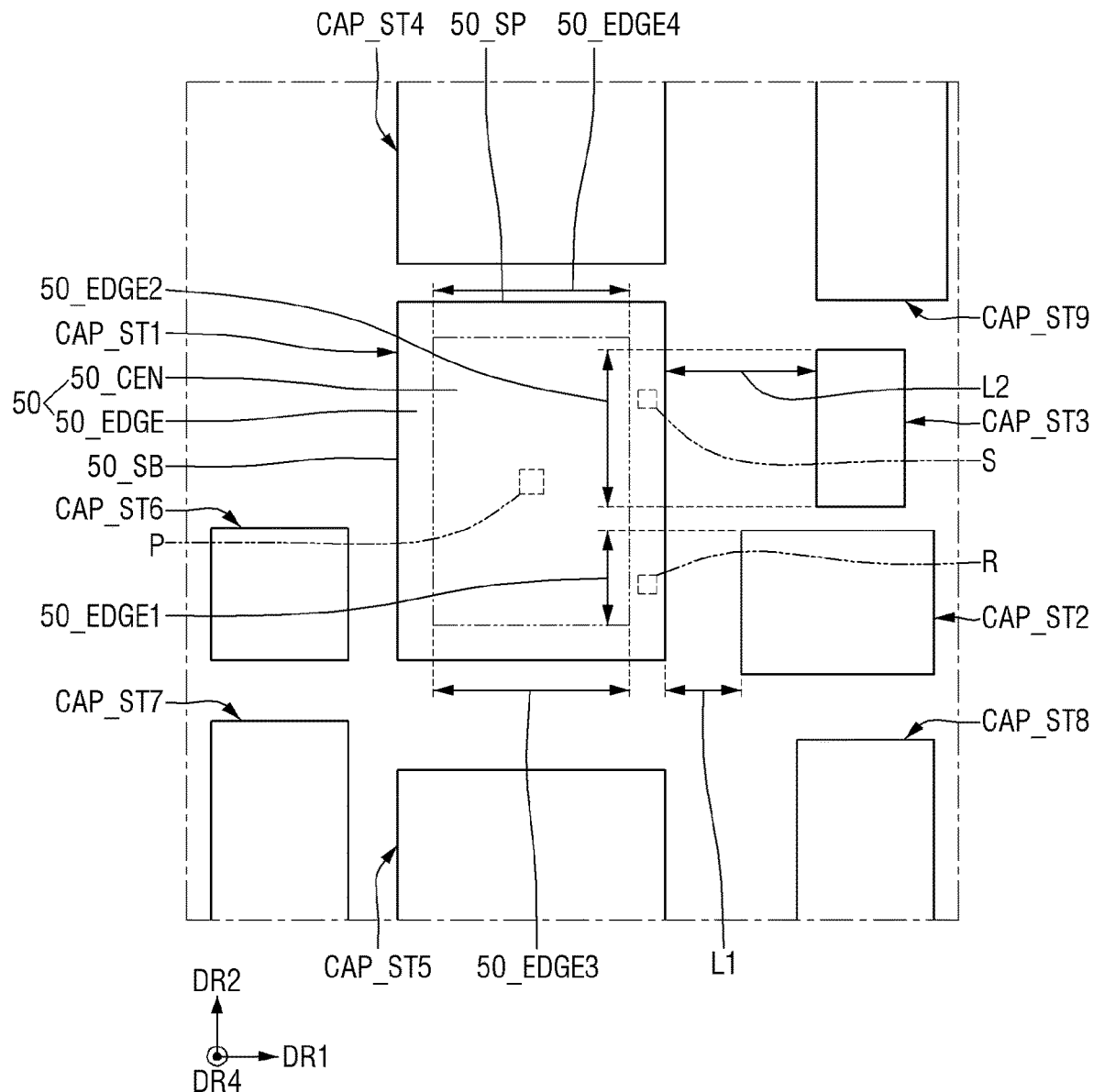
FIG. 16 is a schematic plan view for explaining the semiconductor device according to some embodiments.
Figure 17:
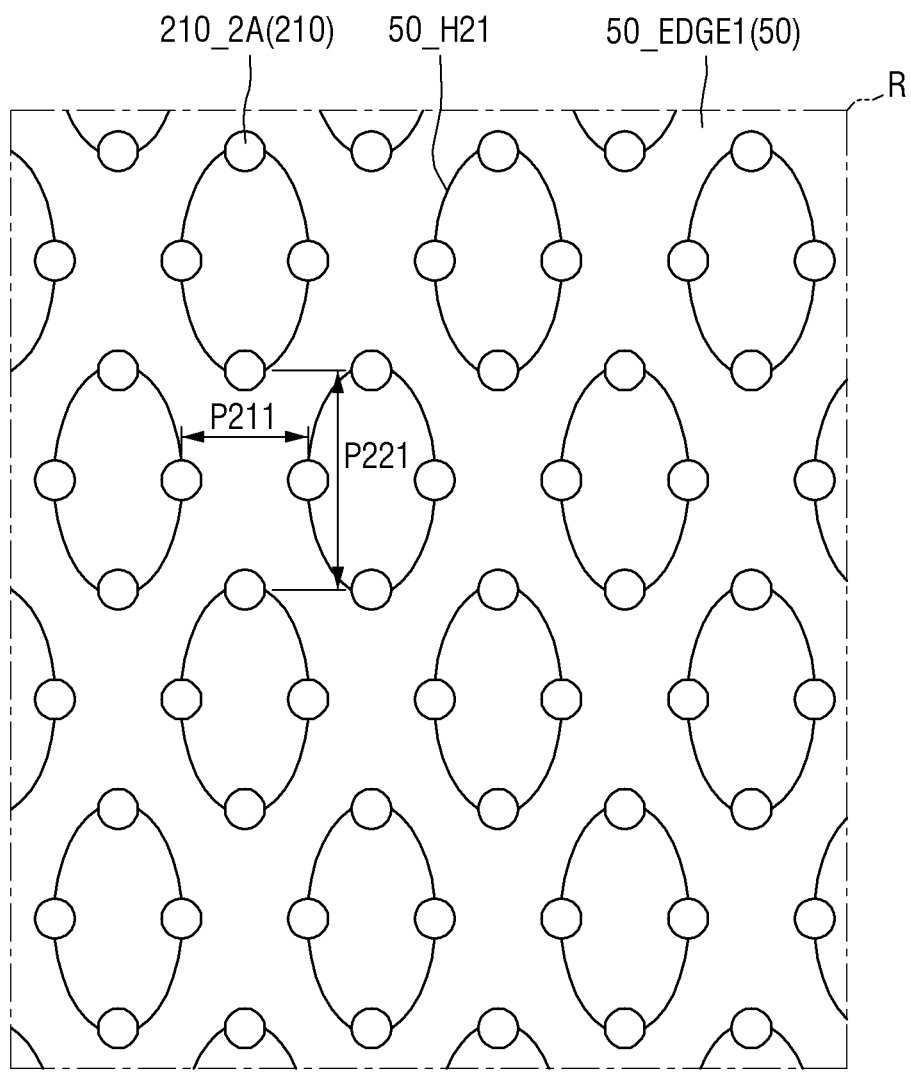
FIG. 17 is an enlarged plan view of a portion R of FIG. 16.
Figure 18:
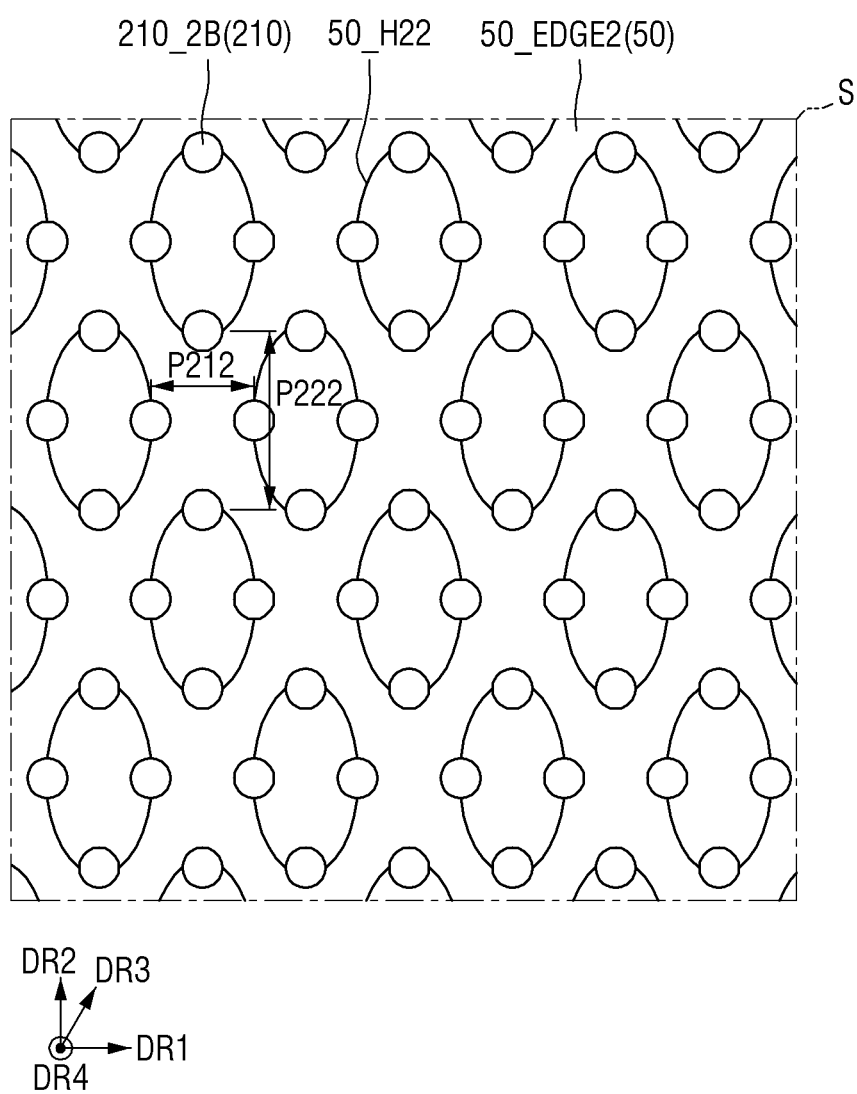
FIG. 18 is an enlarged plan view of a portion S of FIG. 16.

FIG. 16 is a schematic plan view for explaining the semiconductor device according to some embodiments. FIG. 17 is an enlarged plan view of a portion R of FIG. 16. FIG. 18 is an enlarged plan view of a portion S of FIG. 16.

Since the enlarged plan view of the P portion of FIG. 16 is the same as that of FIG. 2, the description will be centered on FIGS. 17 and 18 in which the edge region 50_EDGE of the first electrode support 50 is enlarged.

Referring to FIGS. 2, and 16 to 18, the semiconductor device according to some embodiments may include first to ninth capacitor blocks CAP_ST1, CAP_ST2, CAP_ST3, CAP_ST4, CAP_ST5, CAP_ST6, CAP_ST7, CAP_ST8, and CAP_ST9.

The second to ninth capacitor blocks CAP_ST2, CAP_ST3, CAP_ST4, CAP_ST5, CAP_ST6, CAP_ST7, CAP_ST8, and CAP_ST9 may be disposed around the first capacitor block CAP_ST1. Although the eight capacitor blocks are shown as being disposed around the first capacitor block CAP_ST1, the present invention is not limited thereto.

The second to ninth capacitor blocks CAP_ST2, CAP_ST3, CAP_ST4, CAP_ST5, CAP_ST6, CAP_ST7, CAP_ST8, and CAP_ST9 may have the same structure as that of the first capacitor block CAP_ST1. However, the lower structures connected to the second to ninth capacitor blocks CAP_ST2, CAP_ST3, CAP_ST4, CAP_ST5, CAP_ST6, CAP_ST7, CAP_ST8, and CAP_ST9 may be different from each other. As an example, the second to ninth capacitor blocks CAP_ST2, CAP_ST3, CAP_ST4, CAP_ST5, CAP_ST6, CAP_ST7, CAP_ST8, and CAP_ST9 may be connected to the landing pad 160 described in FIGS. 2 to 4 and 12. As another example, the second to ninth capacitor blocks CAP_ST2, CAP_ST3, CAP_ST4, CAP_ST5, CAP_ST6, CAP_ST7, CAP_ST8, and CAP_ST9 may be connected to the plate lower electrode 190 described in FIGS. 8 and 9. As yet another example, some of the second to ninth capacitor blocks CAP_ST2, CAP_ST3, CAP_ST4, CAP_ST5, CAP_ST6, CAP_ST7, CAP_ST8, and CAP_ST9 may be connected to the landing pad 160 described in FIGS. 2, 4 and 12, and the rest may be connected to the plate lower electrode 190 described in FIGS. 8 and 9.

A second capacitor block CAP_ST2 and a third capacitor block CAP_ST3 will be described as an example.

The second capacitor block CAP_ST2 and the third capacitor block CAP_ST3 may be disposed separately from the first capacitor block CAP_ST1 in the first direction DR1, respectively.

The second capacitor block CAP_ST2 may be spaced apart from the first capacitor block CAP_ST1 in the first direction D1 by a first distance L1. The third capacitor block CAP_ST3 may be spaced apart from the first capacitor block CAP_ST1 in the first direction D1 by a second distance L2.

In the semiconductor device according to some embodiments, the first distance L1 by which the first capacitor block CAP_ST1 and the second capacitor block CAP_ST2 are spaced apart is different from the second distance L2 by which the first capacitor block CAP_ST1 and the third capacitor block CAP_ST3 are spaced apart. For example, the second distance L2 may be greater than the first distance L1.

A stress received by the lower electrode 210 that comes into contact with the edge region 50_EDGE of the first electrode support may vary depending on the distance between the first capacitor block CAP_ST1 and the surrounding capacitor blocks. That is, the degree of bending of the second lower electrode (210_2 of FIG. 6) may vary depending on the distance between the first capacitor block CAP_ST1 and the surrounding capacitor blocks.

The edge region 50_EDGE of the first electrode support 50 may include, for example, a first sub-edge region 50_EDGE1, a second sub-edge region 50_EDGE2, a third sub-edge region 50_EDGE3, and a fourth sub-edge region 50_EDGE4.

The first sub-edge region 50_EDGE1 of the first electrode support 50 may be a portion of the edge region 50_EDGE of the first electrode support 50 that overlaps the second capacitor block CAP_ST2 in the first direction DR1. The second sub-edge region 50_EDGE2 of the first electrode support 50 may be a portion of the edge region 50_EDGE of the first electrode support 50 that overlaps the third capacitor block CAP_ST3 in the first direction DR1. The third sub-edge region 50_EDGE3 of the first electrode support 50 may be a portion of the edge region 50_EDGE of the first electrode support that overlaps the fifth capacitor block CAP_ST5 in the second direction DR2. The fourth sub-edge region 50_EDGE4 of the first electrode support 50 may be a portion of the edge region 50_EDGE of the first electrode support that overlaps the fourth capacitor block CAP_ST4 in the second direction DR2.

For example, a part of the edge region 50_EDGE of the first electrode support 50 that overlaps the second capacitor block CAP_ST2 in the first direction DR1 may overlap the fifth capacitor block CAP_ST5 in the second direction DR2. Hereinafter, it will be described that the first sub-edge region 50_EDGE1 of the first electrode support 50 does not include a portion that overlaps the fifth capacitor block CAP_ST5 in the second direction DR2, in the edge region 50_EDGE of the first electrode support 50 that overlaps the second capacitor block CAP_ST2 in the first direction DR1.

The edge region 50_EDGE of the first electrode support includes a plurality of first sub-edge penetration patterns 50_H21 and second sub-edge penetration patterns 50_H22. The first sub-edge region 50_EDGE1 of the first electrode support 50 includes a plurality of first sub-edge penetration patterns 50_H21. The second sub-edge region 50_EDGE2 of the first electrode support 50 includes a plurality of second sub-edge penetration patterns 50_H22.

The plurality of lower electrodes 210 may include a plurality of first sub-lower electrodes 210_2A and a plurality of second sub-lower electrodes 210_2B. The plurality of first sub-lower electrodes 210_2A may come into contact with the first sub-edge region 50_EDGE1 of the first electrode support 50. The plurality of second sub-lower electrodes 210_2B may come into contact with the second sub-edge region 50_EDGE2 of the first electrode support 50.

In the first sub-edge region 50_EDGE1 of the first electrode support 50, a plurality of first sub-edge penetration patterns 50_H21 may be repeatedly disposed along the first direction DR1 and the second direction DR2. The first sub-edge region 50_EDGE1 of the first electrode support 50 may include first sub-edge penetration patterns 50_H21 arranged/aligned in the first direction DR1. The first sub-edge region 50_EDGE1 of the first electrode support 50 may include first sub-edge penetration patterns 50_H21 arranged/aligned in the second direction DR2.

In the first sub-edge region 50_EDGE1 of the first electrode support 50, the first sub-edge penetration patterns 50_H21 adjacent to each other in the first direction DR1 may be spaced apart by a sixth interval P211. The first sub-edge penetration patterns 50_H21 adjacent to each other in the second direction DR2 may be spaced apart by a seventh interval P221.

In the second sub-edge region 50_EDGE2 of the first electrode support 50, a plurality of second sub-edge penetration patterns 50_H22 may be repeatedly disposed along the first direction DR1 and the second direction DR2. The second sub-edge region 50_EDGE2 of the first electrode support 50 may include second sub-edge penetration patterns 50_H22 arranged/aligned in the first direction DR1. The second sub-edge region 50_EDGE2 of the first electrode support 50 may include second sub-edge penetration patterns 50_H22 arranged/aligned in the second direction DR2.

In the second sub-edge region 50_EDGE2 of the first electrode support 50, the second sub-edge penetration patterns 50_H22 adjacent to each other in the first direction DR1 may be spaced apart by an eighth interval P212. The second sub-edge penetration patterns 50_H22 adjacent to each other in the second direction DR2 may be spaced apart by a ninth interval P222.

In the semiconductor device according to some embodiments, the interval by which the first sub-edge penetration patterns 50_H21 adjacent to each other are spaced apart in the first sub-edge region 50_EDGE1 of the first electrode support 50 is different from the interval by which the second sub-edge penetration patterns 50_H22 adjacent to each other are spaced apart in the second sub-edge region 50_EDGE2 of the first electrode support 50. For example, the interval by which the first sub-edge penetration patterns 50_H21 adjacent to each other are spaced apart in the first sub-edge region 50_EDGE1 of the first electrode support 50 is greater than the interval by which the second sub-edge penetration patterns 50_H22 adjacent to each other are spaced apart in the second sub-edge region 50_EDGE2 of the first electrode support 50.

As an example, more specifically, the sixth interval P211 by which the adjacent first sub-edge penetration patterns 50_H21 are spaced apart in the first direction DR1 is greater than the eighth interval P212 by which the adjacent second sub-edge penetration patterns 50_H22 are spaced apart in the first direction. The seventh interval P221 by which the adjacent first sub-edge penetration patterns 50_H21 are spaced apart in the second direction DR2 is greater than the ninth interval P222 by which the adjacent second sub-edge penetration patterns 50_H22 are spaced apart in the second direction DR2.

As another example, more specifically, the sixth interval P211 by which the adjacent first sub-edge penetration patterns 50_H21 are spaced apart in the first direction DR1 is greater than the eighth interval P212 by which the adjacent second sub-edge penetration patterns 50_H22 are spaced apart in the first direction DR1. The seventh interval P221 by which the adjacent first sub-edge penetration patterns 50_H21 are spaced apart in the second direction DR2 may be the same as the ninth interval P222 by which the adjacent second sub-edge penetration patterns 50_H22 are spaced apart in the second direction DR2.

As still another example, more specifically, the sixth interval P211 by which the adjacent first sub-edge penetration patterns 50_H21 are spaced apart in the first direction DR1 may be the same as the eighth interval P212 by which the adjacent second sub-edge penetration patterns 50_H22 are spaced apart in the first direction DR1. The seventh interval P221 by which the adjacent first sub-edge penetration patterns 50_H21 are spaced apart in the second direction DR2 is greater than the ninth interval P222 by which the adjacent second sub-edge penetration patterns 50_H22 are spaced apart in the second direction DR2.

For example, the intervals P11 and P12 by which the first center penetration patterns 50_H1 adjacent to each other are spaced apart in the center region 50_CEN of the first electrode support are greater than the intervals P211 and P221 by which the first sub-edge penetration patterns 50_H21 adjacent to each other are spaced apart in the first sub-edge region 50_EDGE1 of the first electrode support 50. The intervals P11 and P12 by which the first center penetration patterns 50_H1 adjacent to each other are spaced apart in the center region 50_CEN of the first electrode support are greater than the intervals P212 and P222 by which the second sub-edge penetration patterns 50_H22 adjacent to each other are spaced apart in the second sub-edge region 50_EDGE2 of the first electrode support 50.

Although the second capacitor block CAP_ST2 and the third capacitor block CAP_ST3 are described as being adjacent to the first capacitor block CAP_ST1 in the first direction DR1, the present invention is not limited thereto.

The description about the spaced interval of the first penetration patterns 50_H21 and 50_H22 may be applied as it is, even in a case where the second capacitor block CAP_ST2 is adjacent to the first capacitor block CAP_ST1 in the first direction DR1, and the third capacitor block CAP_ST3 is adjacent to the first capacitor block CAP_ST1 in the second direction DR2.

Figure 19:
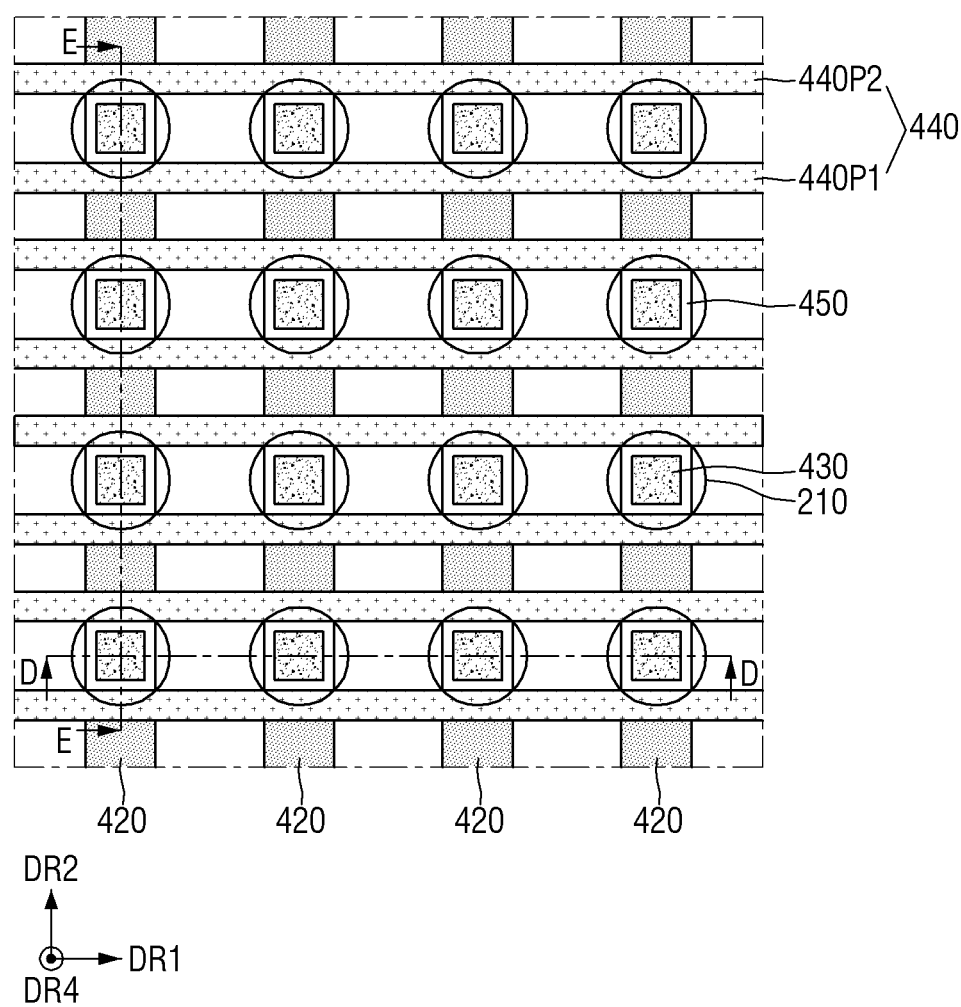
FIG. 19 is a layout diagram for explaining a semiconductor memory device according to some embodiments.
Figure 20:
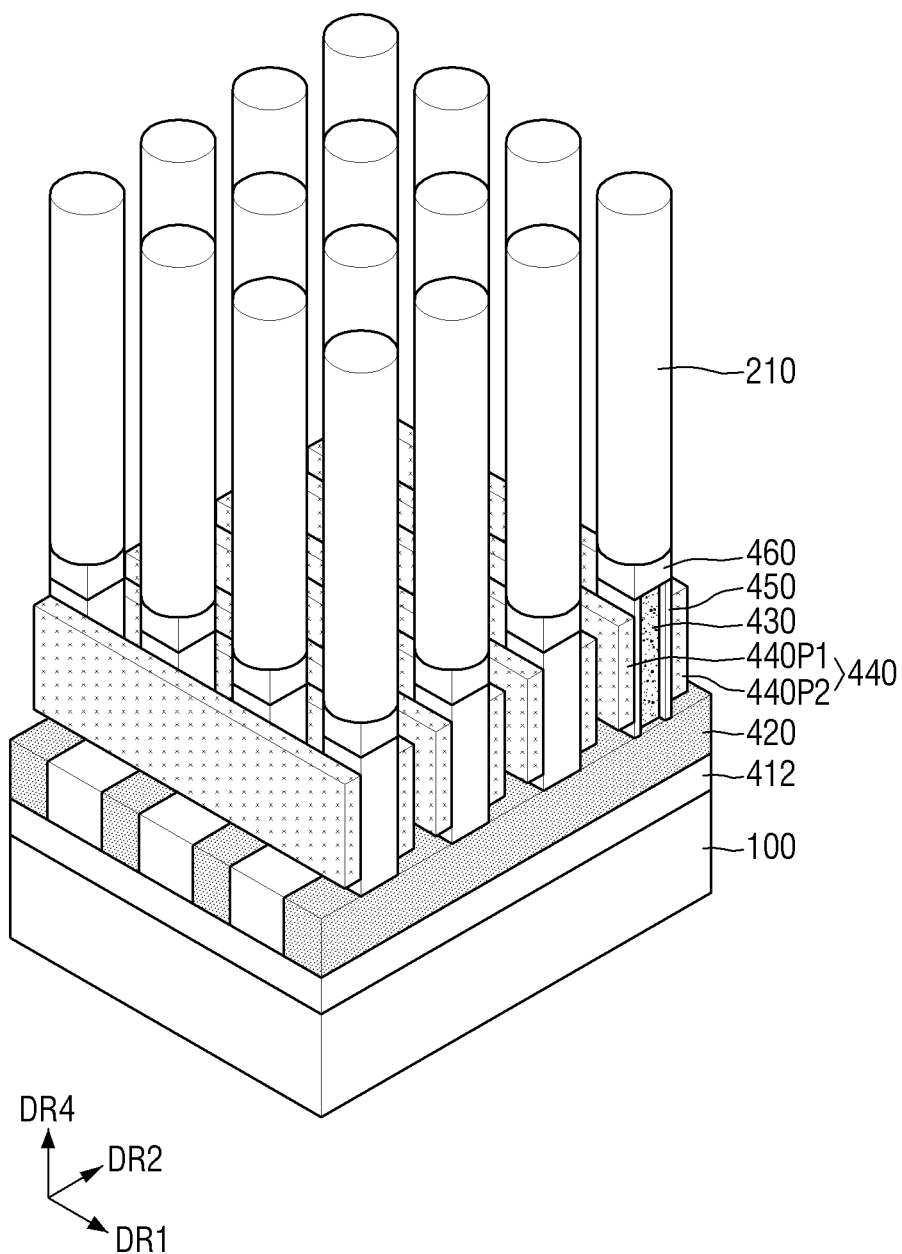
FIG. 20 is a perspective view of the semiconductor memory device of FIG. 19 according to some embodiments.
Figure 21:
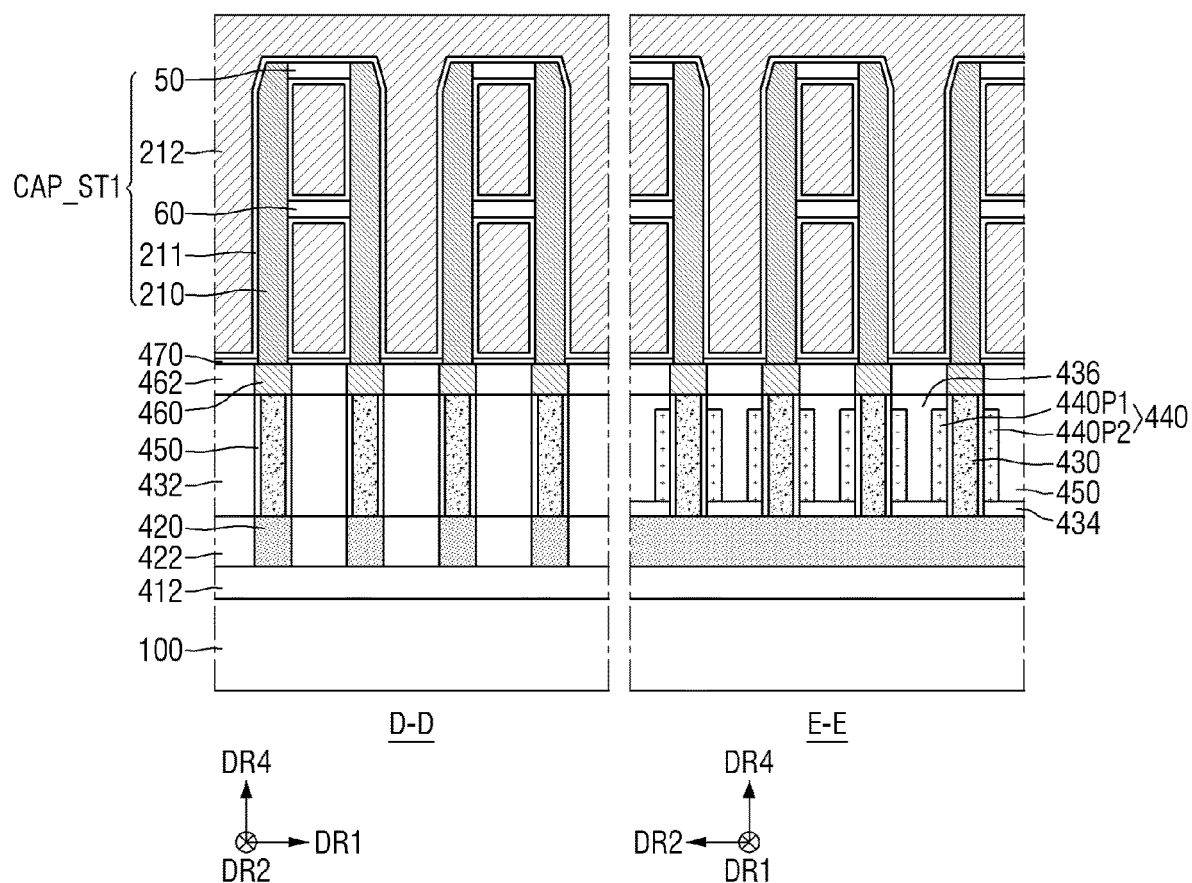
FIG. 21 is a cross-sectional view taken along lines D-D and E-E of FIG. 19.

FIG. 19 is a layout diagram for explaining a semiconductor memory device according to some embodiments. FIG. 20 is a perspective view for explaining the semiconductor memory device according to some embodiments. FIG. 21 is a cross-sectional view taken along lines D-D and E-E of FIG. 19.

For reference, FIG. 19 may be an enlarged view of a region P and a region Q of FIG. 1.

Referring to FIGS. 19 to 21, the semiconductor device according to some embodiments may include a substrate 100, a plurality of first conductive lines 420, a channel layer 430, a gate electrode 440, a gate insulating film 450, and a first capacitor block CAP_ST1. The semiconductor device according to some embodiments may be a memory device including a vertical channel transistor (VCT). The vertical channel transistor may refer to a structure in which a channel length of the channel layer 430 extends from the substrate 100 along a vertical direction.

A lower insulating layer 412 may be disposed on the substrate 100. A plurality of first conductive lines 420 may be spaced apart from each other in the first direction DR1 and extend in the second direction DR2 on the lower insulating layer 412. A plurality of first insulating patterns 422 may be disposed on the lower insulating layer 412 to fill the space between the plurality of first conductive lines 420. The plurality of first insulating patterns 422 may extend in the second direction DR2. The upper surfaces of the plurality of first insulating patterns 422 may be disposed at the same level as (i.e., may be coplanar with) the upper surfaces of the plurality of first conductive lines 420. The plurality of first conductive lines 420 may function as bit lines.

The plurality of first conductive lines 420 may include a doped semiconductor material, a metal, a conductive metal nitride, a conductive metal silicide, a conductive metal oxide, or a combination thereof. For example, the plurality of first conductive lines 420 may be made up of, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof. The plurality of first conductive lines 420 may include a single layer or multiple layers of the above-mentioned materials. In example embodiments, the plurality of first conductive lines 420 may include graphene, carbon nanotube or a combination thereof.

The channel layers 430 may be arranged in the form of a matrix in which they are disposed apart from each other in the first direction DR1 and the second direction DR2 on the plurality of first conductive lines 420. The channel layer 430 may have a first width along the first direction DR1 and a first height along the fourth direction DR4, and the first height may be greater than the first width. For example, the first height may be, but is not limited to, about 2 to 10 times the first width. Although not shown, a bottom portion of the channel layer 430 may function as a third source/drain region, an upper portion of the channel layer 430 may function as a fourth source/drain region, and a part of the channel layer 430 between the third and second source/drain regions may function as a channel region.

In the example embodiments, the channel layer 430 may include an oxide semiconductor, and the oxide semiconductor may include, for example, $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$ or combinations thereof. The channel layer 430 may include a single layer or multiple layers of the oxide semiconductor. In some embodiments, the channel layer 430 may have a bandgap energy that is greater than the bandgap energy of silicon. For example, the channel layer 430 may have bandgap energy of about 1.5 eV to 5.6 eV. For example, the channel layer 430 may have optimum channel performance when having the bandgap energy of about 2.0 eV to 4.0 eV. For example, the channel layer 430 may be, but is not limited to, polycrystalline or amorphous. In the example embodiments, the channel layer 430 may include graphene, carbon nanotube or a combination thereof.

The gate electrode 440 may extend in the first direction DR1 on opposite side walls of the channel layer 430. The gate electrode 440 may include a first sub-gate electrode 440P1 facing the first side wall of the channel layer 430, and a second sub-gate electrode 440P2 facing the second side wall opposite to the first side wall of the channel layer 430. Since one channel layer 430 is disposed between the first sub-gate electrode 440P1 and the second sub-gate electrode 440P2, the semiconductor device may have a dual gate transistor structure. However, the present disclosure is not limited thereto, and the second sub-gate electrode 440P2 may be omitted, and only the first sub-gate electrode 440P1 facing the first side wall of the channel layer 430 may be formed to implement a single gate transistor structure. The material included in the gate electrode 440 may be the same as that described with respect to the cell gate electrode 112.

The gate insulating film 450 surrounds the side walls of the channel layer 430 and may be interposed between the channel layer 430 and the gate electrode 440. For example, as shown in FIG. 19, the entire side walls of the channel layer 430 may be surrounded by the gate insulating film 450, and a part of the side walls of the gate electrode 440 may come into contact with the gate insulating film 450. In other embodiments, the gate insulating film 450 extends in an extension direction of the gate electrode 440 (that is, the first direction DR1), and among the side walls of the channel layer 430, only the two side walls that face the gate electrode 440 may come into contact with the gate insulating film 450. In the example embodiments, the gate insulating film 450 may be made up of a silicon oxide film, a silicon oxynitride film, a high dielectric constant material having a higher dielectric constant than that of silicon oxide film or a combination thereof.

A plurality of second insulating patterns 432 may extend along the second direction DR2 on the plurality of first insulating patterns 422. The channel layer 430 may be disposed between two adjacent second insulating patterns 432 among the plurality of second insulating patterns 432. In addition, a first buried layer 434 and a second buried layer 436 may be disposed in the space between the two adjacent channel layers 430, between the two adjacent second insulating patterns 432. The first buried layer 434 may be disposed at the bottom portion of the space between the two adjacent channel layers 430. The second buried layer 436 may be formed to fill the rest of the space between the two adjacent channel layers 430 on the first buried layer 434. The upper surface of the second buried layer 436 is coplanar with the upper surface of the channel layer 430, and the second buried layer 436 may cover the upper surface of the second gate electrode 440. Unlike this, a plurality of second insulating patterns 432 may be formed by a material layer that is continuous with a plurality of first insulating patterns 422, or the second buried layer 436 may also be formed of a material layer that is continuous with the first buried layer 434.

Capacitor contacts 460 may be disposed on the channel layer 430. The capacitor contacts 460 are disposed to vertically overlap the channel layer 430, and may be arranged in the form of a matrix in which they are spaced apart in the first direction DR1 and the second direction DR2. The capacitor contact 460 may be made up of, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof. The upper insulating film 462 may surround the side walls of the capacitor contact 460 on the plurality of second insulating patterns 432 and the second buried layer 436.

A cell etching stop film 470 may be disposed on the upper insulating layer 462. The first capacitor block CAP_ST1 may be disposed on the cell etching stop film 470. The cell etching stop film 470 may correspond to the etching stop film 165 of FIG. 3.

The first capacitor block CAP_ST1 includes a plurality of lower electrodes 210, a capacitor dielectric film 211, an upper electrode 212, a first electrode support 50, and a second electrode support 60. The description about the first capacitor block CAP_ST1 may be substantially the same as that described using FIGS. 1 to 7.

The lower electrode 210 penetrates the cell etching stop film 470 and may be electrically connected to the upper surface of the capacitor contact 460. In some example embodiments, the lower electrodes 210 are disposed to vertically overlap the capacitor contact 460, and may be arranged in the form of a matrix in which they are spaced apart from each other in the first direction DR1 and the second direction DR2. Unlike the shown example, a landing pad may be further disposed between the capacitor contact 460 and the lower electrode 210, and the lower electrode 210 may be disposed in a hexagonal shape.

Figure 22:
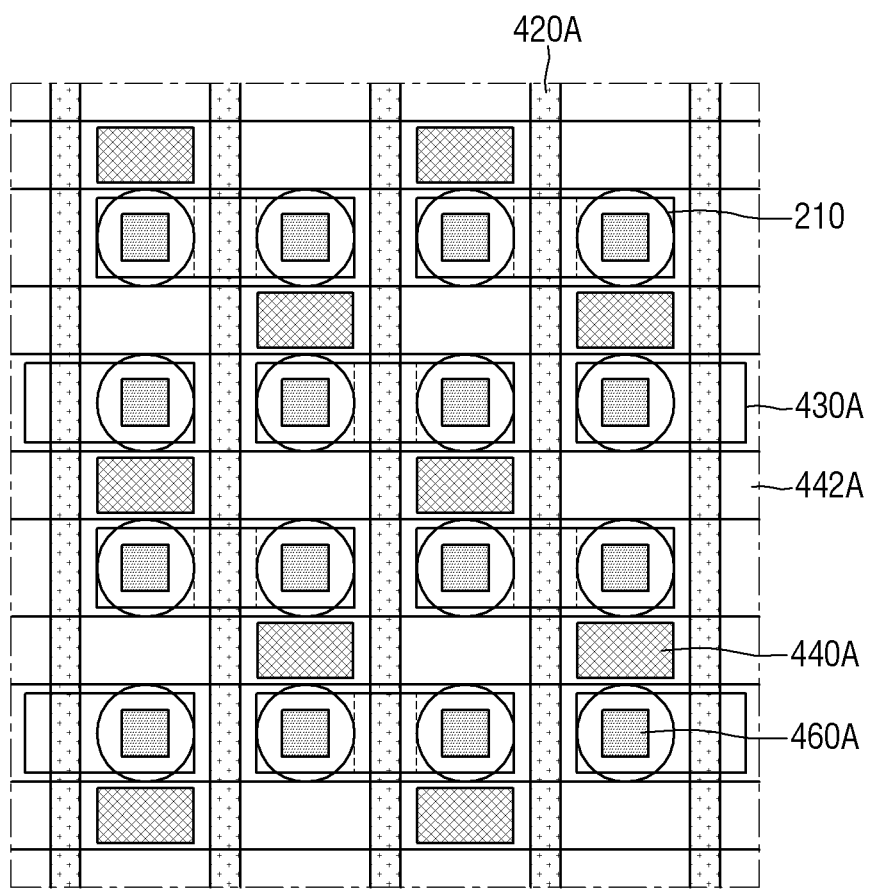
FIG. 22 is a layout diagram for explaining a semiconductor device according to some embodiments.
Figure 23:
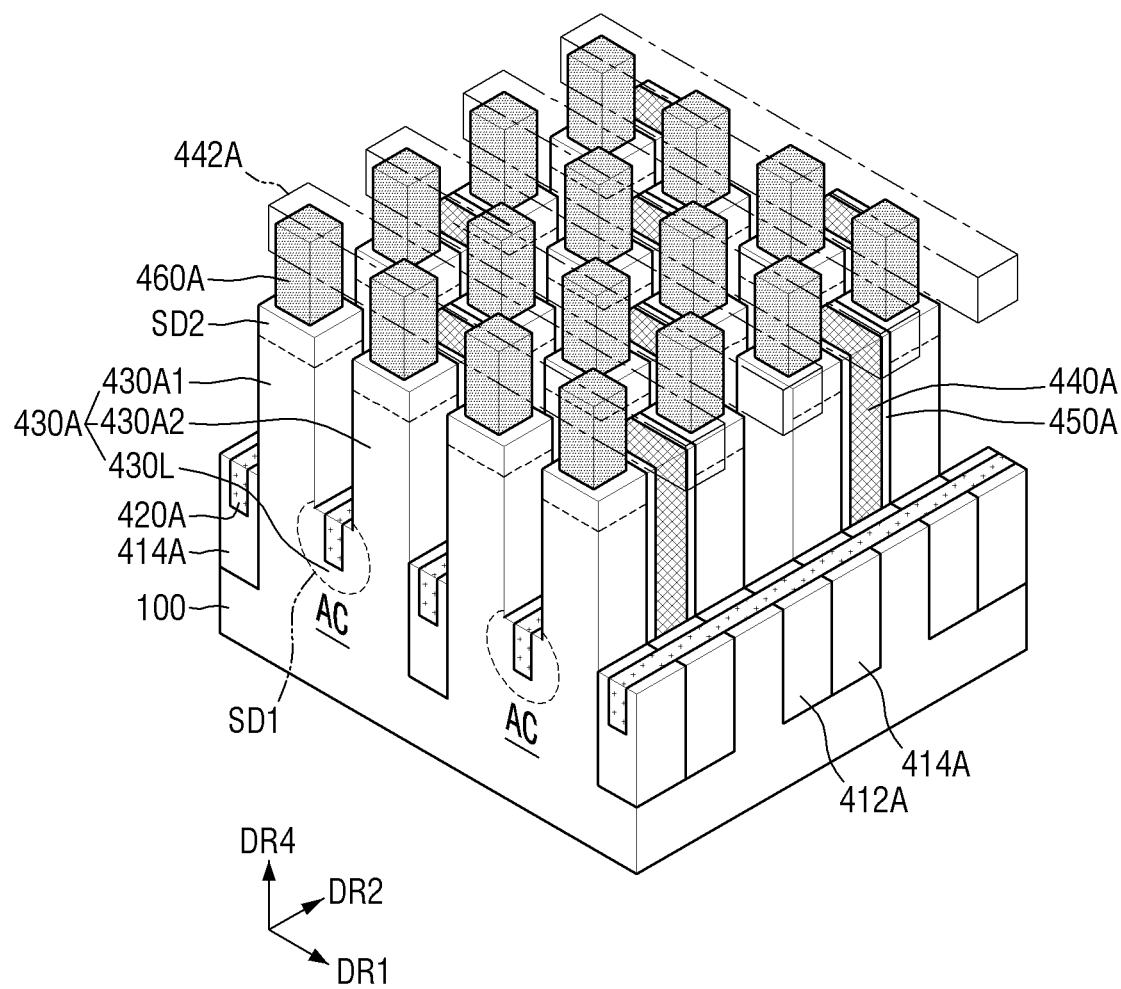
FIG. 23 is a perspective view of the semiconductor device of FIG. 22 according to some embodiments.

FIG. 22 is a layout diagram for explaining the semiconductor device according to some embodiments. FIG. 23 is a perspective view for explaining the semiconductor device according to some embodiments.

Referring to FIGS. 22 and 23, the semiconductor device according to some embodiments may include a substrate 100, a plurality of first conductive lines 420A, a channel structure 430A, a contact gate electrode 440A, a plurality of second conductive lines 442A, and a first capacitor block CAP_ST1. The semiconductor memory device according to some embodiments may be a memory device including a vertical channel transistor VCT.

A plurality of active regions AC may be defined on the substrate 100 by the first element separation pattern 412A and the second element separation pattern 414A. The channel structure 430A may be disposed inside each active region AC. The channel structure 430A may include a first active pillar 430A1 and a second active pillar 430A2 each extending in the vertical direction, and a connecting portion 430L connected to the bottom portion of the first active pillar 430A1 and the bottom portion of the second active pillar 430A2. A first source/drain region SD1 may be disposed inside the connecting portion 430L. A second source/drain region SD2 may be disposed above the first and second active pillars 430A1 and 430A2. The first active pillar 430A1 and the second active pillar 430A2 may each form an independent unit memory cell.

The plurality of first conductive line 420A may extend in a direction that intersects each of the plurality of active regions AC, and may extend, for example, in the second direction DR2. A single first conductive line 420A among the plurality of first conductive lines 420A may be disposed on the connecting portion 430L between the first active pillar 430A1 and the second active pillar 430A2. Further, the single first conductive line 420A may be disposed on the first source/drain region SD1. The other first conductive line 420A adjacent to the single first conductive line 420A may be disposed between the two channel structures 430A. The single first conductive line 420A among the plurality of first conductive lines 420A may function as a common bit line included in two unit memory cells formed by the first active pillar 430A1 and the second active pillar 430A2 disposed on opposite sides of the single first conductive line 420A.

A single contact gate electrode 440A may be disposed between two channel structures 430A adjacent to each other in the second direction DR2. For example, the contact gate electrode 440A may be disposed between the first active pillar 430A1 included in the single channel structure 430A and the second active pillar 430A2 of the channel structure 430A adjacent thereto. The single contact gate electrode 440A may be shared by the first active pillar 430A1 and the second active pillar 430A2 disposed on opposite side walls thereof. A gate insulating film 450A may be disposed between the contact gate electrode 440A and the first active pillar 430A1, and between the contact gate electrode 440A and the second active pillar 430A2. The plurality of second conductive lines 442A may extend in the first direction DR1 on the upper surface of the contact gate electrode 440A. The plurality of second conductive lines 442A may function as word lines of the semiconductor device.

A capacitor contact 460A may be disposed on the channel structure 430A. The capacitor contact 460A may be disposed on the second source/drain region SD2, and the first capacitor block CAP_ST1 may be disposed on the capacitor contact 460A.

Figure 24:
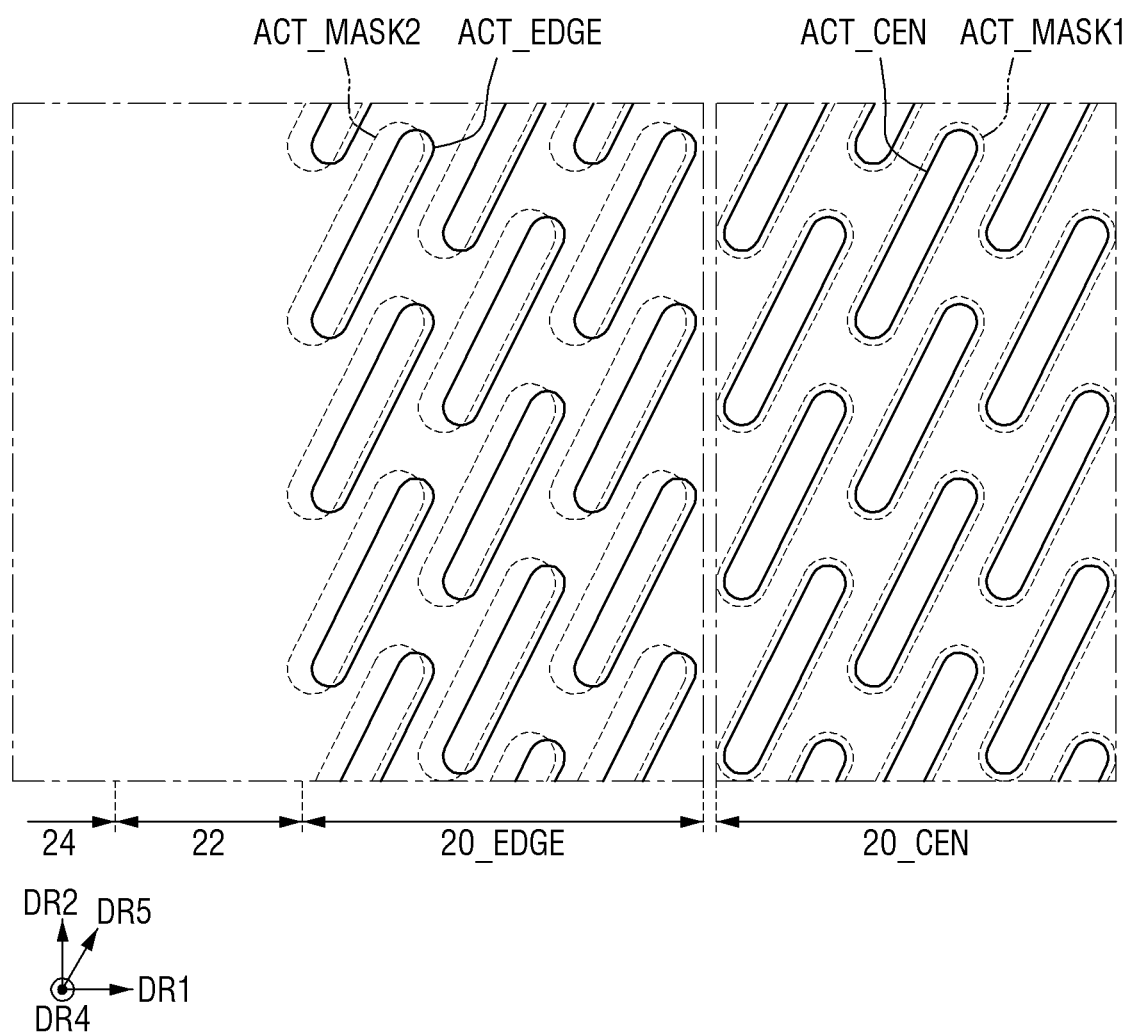
FIG. 24 is a plan view of a semiconductor device according to some embodiments.

FIG. 24 is a diagram for explaining the semiconductor device according to some embodiments.

For reference, FIG. 24 may be a diagram relating to the formation of the cell active region of the cell region.

Referring to FIG. 24, the semiconductor device according to some embodiments may include a cell region 20, a cell separation region 22, and a core/peri region 24.

The cell region 20 may be a region in which the memory cell for storing information is formed. The core/peri region 24 may be a region in which a peripheral circuit for driving the memory cell is formed. The cell separation region 22 may be a region that separates the cell region 20 and the core/peri region 24.

The cell region 20 may include a center cell region 20_CEN, and an edge cell region 20_EDGE defined along the periphery of the center cell region 20_CEN. The edge cell region 20_EDGE may form a boundary with the cell separation region 22.

The cell region 20 may include a plurality of cell active regions ACT_CEN and ACT_EDGE. The cell active regions ACT_CEN and ACT_EDGE may be disposed in the form of a bar of a diagonal line (or an oblique line). For example, the cell active regions ACT_CEN and ACT_EDGE may extend in a fifth direction DR5. The fifth direction DR5 may be a direction that is different from the third direction DR3 of FIG. 3.

The cell active region may include a center cell active region ACT_CEN and an edge cell active region ACT_EDGE. The center cell active region ACT_CEN is formed in the center cell region 20_CEN, and the edge cell active region ACT_EDGE may be formed in the edge cell region 20_EDGE.

For example, the distance by which the adjacent center cell active regions ACT_CEN are spaced apart in the first direction DR1 may be the same as the distance by which the adjacent edge cell active regions ACT_EDGE are spaced apart in the first direction DR1.

The center cell active region ACT_CEN may be formed using a first mask pattern ACT_MASK1. The edge cell active region ACT_EDGE may be formed using a second mask pattern ACT_MASK2. The first mask pattern ACT_MASK1 and the second mask pattern ACT_MASK2 may be included in a photomask used to form the cell active regions ACT_CEN and ACT_EDGE.

In the semiconductor device according to some embodiments, the distance by which the first mask patterns ACT_MASK1 are spaced apart in the first direction DR1 may be smaller than the distance by which the second mask patterns ACT_MASK2 are spaced apart in the first direction DR1.

The distance by which the first mask patterns ACT_MASK1 are spaced apart in the first direction DR1 is assumed to be the same as the distance by which the second mask patterns ACT_MASK2 are spaced apart in the first direction DR1. The center cell active region ACT_CEN may be regularly formed around the center cell active region ACT_CEN.

Since the center cell region 20_CEN is located on one side of the edge cell region 20_EDGE, the edge cell active region ACT_EDGE may be regularly formed on one side of the edge cell active region ACT_EDGE. However, since the core/peri region 24 is located on the other side of the edge cell region 20_EDGE, the edge cell active region ACT_EDGE is not formed on another (e.g., an opposite) side of the edge cell active region ACT_EDGE. That is, since a difference in the surrounding environment between one side and the other side of the edge cell region 20_EDGE occurs, the edge cell active region ACT_EDGE may bend to the center cell active region ACT_CEN. That is, the distance by which the adjacent edge cell active regions ACT_EDGE are spaced apart in the first direction DR1 may be smaller than the distance by which the adjacent center cell active regions ACT_CEN are spaced apart in the first direction DR1.

If the interval between the cell active regions ACT_CEN and ACT_EDGE changes depending on the position of the cell region 20, process defects such as contact defects or an increase in contact resistance may occur in the subsequent manufacturing process.

Considering that the edge cell active region ACT_EDGE bends toward the center of the cell region 20, the photomask used for forming the cell active regions ACT_CEN and ACT_EDGE may be fabricated such that the spaced distance of the second mask patterns ACT_MASK2 in the first direction DR1 is greater than the spaced distance of the first mask patterns ACT_MASK1 in the first direction DR1.

Figure 25:
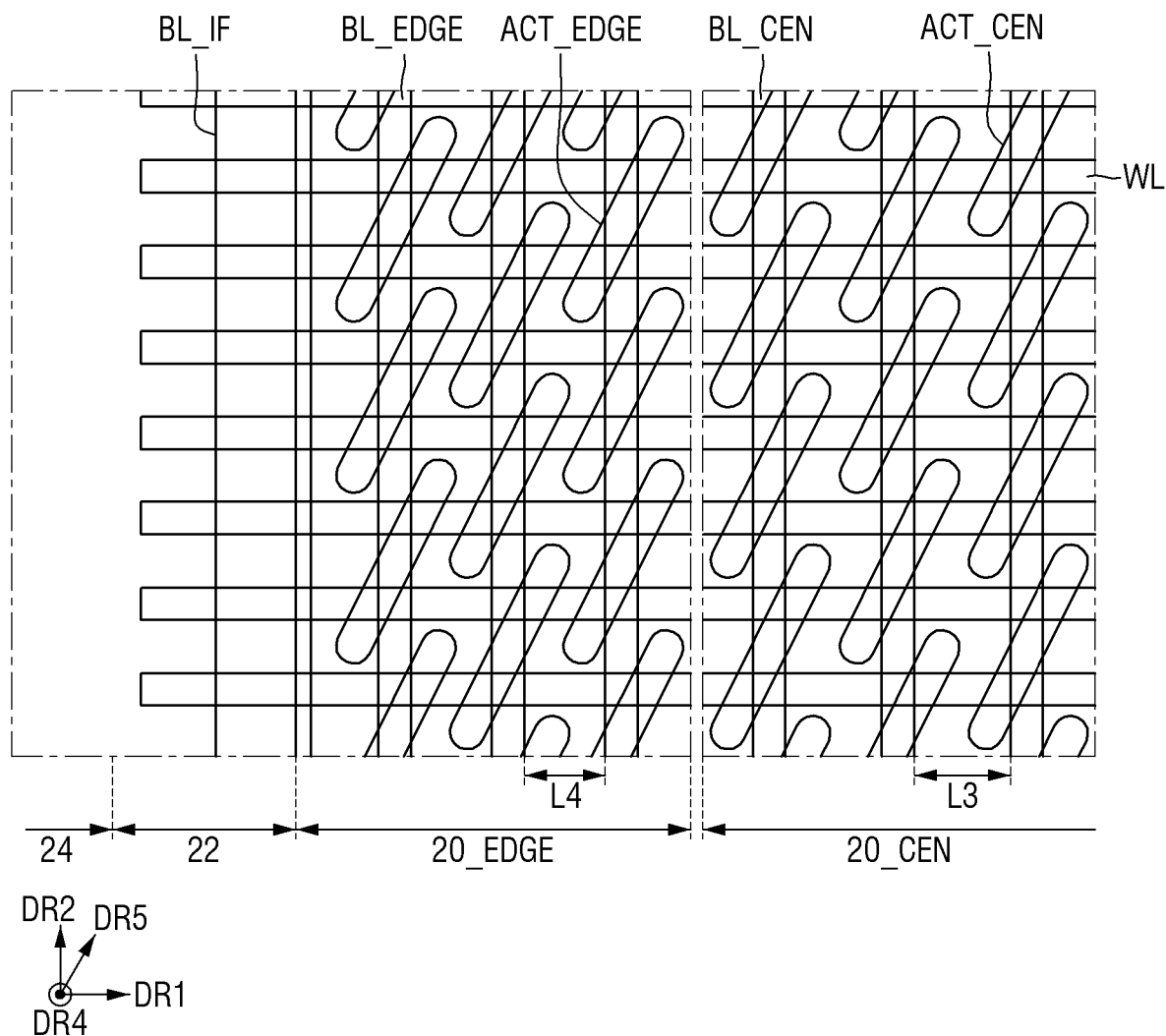
FIG. 25 is a plan view of a semiconductor device according to some embodiments.

FIG. 25 is a diagram for explaining a semiconductor device according to some embodiments. For convenience of explanation, points different from those described using FIG. 24 will be mainly described.

For reference, FIG. 25 is a schematic layout diagram of a semiconductor memory device.

Referring to FIG. 25, the distance by which the adjacent center cell active regions ACT_CEN are spaced apart in the first direction DR1 is greater than the distance by which the adjacent edge cell active regions ACT_EDGE are spaced apart in the first direction DR1.

In the photomask used for forming the cell active regions ACT_CEN and ACT_EDGE of FIG. 24, the spaced distance of the second mask patterns ACT_MASK2 in the first direction DR1 may be the same as the spaced distance of the first mask patterns ACT_MASK1 in the first direction DR1.

The word line WL may extend in the first direction DR1 across the cell active regions ACT_CEN and ACT_EDGE.

The bit lines BL_CEN and BL_EDGE are disposed on the word line WL and may be disposed in the second direction DR2. The bit lines BL_CEN and BL_EDGE may intersect the cell active regions ACT_CEN and ACT_EDGE.

The bit line may include a center bit line BL_CEN and an edge bit line BL_EDGE. The center bit line BL_CEN may be formed in the center cell region 20_CEN. The edge bit line BL_EDGE may be formed in the edge cell region 20_EDGE.

A boundary bit line BL_IF may extend in the second direction DR2 alongside the bit lines BL_CEN and BL_EDGE. At least a part of the boundary bit line BL_IF may be disposed to overlap the cell separation region 22 in the first direction DR1. Unlike the shown example, the semiconductor device according to some embodiments may not include the boundary bit line BL_IF.

The distance between the center bit lines BL_CEN adjacent to each other in the first direction DR1 may be a third distance L3. The distance between the edge bit lines BL_EDGE adjacent to each other in the first direction DR1 may be a fourth distance L4.

Since the distance by which the adjacent center cell active regions ACT_CEN are spaced apart in the first direction DR1 may be greater than the distance by which the adjacent edge cell active regions ACT_EDGE are spaced apart in the first direction DR1, the third distance L3 may be greater than the fourth distance L4.

In concluding the detailed description, those skilled in the art will appreciate that many variations and modifications may be made to the example embodiments without substantially departing from the scope of the present invention. Therefore, the disclosed example embodiments of the invention are used in a generic and descriptive sense only and not for purposes of limitation.

What is claimed is:

1. A semiconductor device comprising:
a plurality of lower electrodes that are aligned with each other on a substrate along a first direction and a second direction different from the first direction; and
a first electrode support that supports the lower electrodes, and includes a plurality of first penetration patterns,
wherein the first electrode support includes a center region, and an edge region defined along a periphery of the center region,
wherein the first penetration patterns comprise center penetration patterns adjacent to each other that are spaced apart by a first interval in the center region, and
wherein the first penetration patterns further comprise edge penetration patterns adjacent to each other that are spaced apart by a second interval different from the first interval in the edge region.

2. The semiconductor device of claim 1, wherein the first interval is greater than the second interval.

3. The semiconductor device of claim 1, further comprising:
a first landing pad and a second landing pad on the substrate and spaced apart from each other,
wherein the plurality of lower electrodes include a first lower electrode and a second lower electrode spaced apart from each other, wherein the first lower electrode is electrically connected to the first landing pad and is not electrically connected to the second landing pad, and wherein the second lower electrode is electrically connected to the second landing pad and is not electrically connected to the first landing pad.

4. The semiconductor device of claim 1, further comprising:

a plate electrode that is between the plurality of lower electrodes and the substrate, wherein each of the lower electrodes is electrically connected to the plate electrode.

5. The semiconductor device of claim 1, wherein the plurality of lower electrodes include a first lower electrode that is in contact with the center region, and a second lower electrode that is in contact with the edge region, wherein a center of an upper portion of the first lower electrode is aligned with a center of a lower portion of the first lower electrode, and wherein a center of an upper portion of the second lower electrode is misaligned with a center of a lower portion of the second lower electrode.

6. The semiconductor device of claim 1, wherein outer walls of the first electrode support include a first side wall extending in the first direction, and a second side wall extending in the second direction, and wherein the edge region includes the first side wall of the first electrode support, and the second side wall of the first electrode support.

7. The semiconductor device of claim 1, further comprising:

a second electrode support that supports the lower electrodes between the substrate and the first electrode support, wherein the second electrode support includes second penetration patterns that are overlapped by the first penetration patterns.

8. The semiconductor device of claim 1, wherein an upper surface of a first lower electrode of the lower electrodes is coplanar with an upper surface of the first electrode support.

9. The semiconductor device of claim 1, wherein a first lower electrode of the lower electrodes protrudes upward beyond an upper surface of the first electrode support.

10. The semiconductor device of claim 1, wherein the lower electrodes extend longitudinally in a third direction that is perpendicular to the first and second directions, and wherein the first and second intervals are each along the first direction, or are each along the second direction.

11. The semiconductor device of claim 1, further comprising:

a capacitor dielectric film that extends along a profile of the lower electrodes and an upper surface and a lower surface of the first electrode support; and an upper electrode on the capacitor dielectric film.

12. A semiconductor device comprising:

a first capacitor block;

a second capacitor block that is spaced apart from the first capacitor block by a first distance in a first direction; and a third capacitor block that is spaced apart from the first capacitor block by a second distance in the first direction, wherein the second distance is greater than the first distance, wherein the first capacitor block includes:

a plurality of lower electrodes that are aligned with each other on a substrate along the first direction and a second direction different from the first direction; and an electrode support that supports the lower electrodes and includes a plurality of penetration patterns, wherein the electrode support includes a center region, and an edge region defined along a periphery of the center region, wherein the edge region includes a first sub-edge region that overlaps the second capacitor block in the first direction, and a second sub-edge region that overlaps the third capacitor block in the first direction, wherein the penetration patterns comprise center penetration patterns adjacent to each other that are spaced apart by a first interval in the center region, wherein the penetration patterns further comprise first sub-edge penetration patterns adjacent to each other that are spaced apart by a second interval in the first sub-edge region, wherein the penetration patterns further comprise second sub-edge penetration patterns adjacent to each other that are spaced apart by a third interval different from the second interval in the second sub-edge region, and wherein the first interval is different from the second interval and the third interval.

13. The semiconductor device of claim 12, wherein the third interval is smaller than the second interval.

14. The semiconductor device of claim 12, wherein the first interval is greater than the second interval and the third interval.

15. The semiconductor device of claim 12, wherein the plurality of lower electrodes include a first lower electrode that is in contact with the center region, and a second lower electrode that is in contact with the edge region, wherein a center of an upper portion of the first lower electrode is aligned with a center of a lower portion of the first lower electrode, and wherein a center of an upper portion of the second lower electrode is misaligned with a center of a lower portion of the second lower electrode.

16. The semiconductor device of claim 12, wherein an upper surface of a first lower electrode of the lower electrodes is coplanar with an upper surface of the electrode support.

17. A semiconductor device comprising:

a plurality of lower electrodes that are aligned with each other on a substrate along a first direction and a second direction different from the first direction, each of the lower electrodes extending longitudinally in a third direction that is perpendicular to the first and second directions; and a first electrode support that supports the lower electrodes, and includes a plurality of first penetration patterns, wherein upper surfaces of the lower electrodes are coplanar with an upper surface of the first electrode support, wherein the first electrode support includes a center region, and an edge region defined along a periphery of the center region, wherein portions of the lower electrodes that are in contact with the edge region bend toward a center of the first electrode support, wherein the first penetration patterns comprise center penetration patterns adjacent to each other that are spaced apart by a first interval, in the center region, and wherein the first penetration patterns further comprise edge penetration patterns adjacent to each other that are spaced apart by a second interval smaller than the first interval, in the edge region.

18. The semiconductor device of claim 17, further comprising:
    a first landing pad and a second landing pad on the substrate and spaced apart from each other,
    wherein the plurality of lower electrodes include a first lower electrode and a second lower electrode spaced apart from each other,
    the first lower electrode is electrically connected to the first landing pad, and not electrically connected to the second landing pad, and
    the second lower electrode is electrically connected to the second landing pad, and not electrically connected to the first landing pad.

19. The semiconductor device of claim 17, further comprising:
    a plate electrode between the plurality of lower electrodes and the substrate,
    wherein the plurality of lower electrodes are electrically connected to the plate electrode.

20. The semiconductor device of claim 17, further comprising:
    a second electrode support that supports the lower electrodes, between the substrate and the first electrode support,
    wherein the second electrode support includes second penetration patterns underlying the first penetration patterns.

* * * * *